US012444627B2

(12) United States Patent
Lai et al.

(10) Patent No.: US 12,444,627 B2
(45) Date of Patent: Oct. 14, 2025

(54) METHOD FOR TRANSFERRING OBJECTS AND TRANSFER APPARATUS USING THE SAME

(71) Applicant: YOUNGTEK ELECTRONICS CORPORATION, Hsinchu (TW)

(72) Inventors: Tsan-Hsiung Lai, Hsinchu (TW); Guang-Chen Chen, Hsinchu (TW); Yang-Chieh Chen, Hsinchu (TW); Wei-Liang Chou, Hsinchu (TW); Ping-Lung Wang, Hsinchu (TW)

(73) Assignee: YOUNGTEK ELECTRONICS CORPORATION, Hsinchu (TW)

( * ) Notice: Subject to any disclaimer, the term of this patent is extended or adjusted under 35 U.S.C. 154(b) by 631 days.

(21) Appl. No.: 17/813,056

(22) Filed: Jul. 18, 2022

(65) Prior Publication Data

US 2023/0026488 A1   Jan. 26, 2023

Related U.S. Application Data

(60) Provisional application No. 63/315,598, filed on Mar. 2, 2022.

(30) Foreign Application Priority Data

Jul. 21, 2021 (CN) .......................... 202110826938.9

(51) Int. Cl.
*H01L 21/67* (2006.01)
*H01L 21/68* (2006.01)
*H01L 21/683* (2006.01)

(52) U.S. Cl.
CPC ...... *H01L 21/67259* (2013.01); *H01L 21/681* (2013.01); *H01L 21/6835* (2013.01); *H01L 2221/68363* (2013.01)

(58) Field of Classification Search
CPC ............. H01L 21/67259; H01L 21/681; H01L 21/6835; H01L 2221/68363; H01L 21/67144; H01L 21/6836; H01L 21/67132
USPC ....................................................... 438/556
See application file for complete search history.

(56) References Cited

U.S. PATENT DOCUMENTS

| 4,896,811 | A | * | 1/1990 | Dunn ..................... H01L 21/68 228/5.5 |
| 5,222,648 | A | * | 6/1993 | Takano .................... B23K 3/08 228/8 |
| 5,338,381 | A | * | 8/1994 | Hidese .............. H01L 21/67132 156/542 |

(Continued)

*Primary Examiner* — Vu A Vu
(74) *Attorney, Agent, or Firm* — McClure, Qualey & Rodack, LLP

(57) ABSTRACT

A method for transferring objects and a transfer apparatus using the same are provided. The method includes the following steps: controlling, during a first period, the ejector at an ejecting working position to perform an ejecting process along with a first direction, to transfer the object from the first substrate to the second substrate; controlling, during a second period, the ejector to move to an ejecting standby position along with a second direction which is non-parallel to the first direction, to expose at least one of the object on the first substrate to a detection range of an image capturing device; detecting the position of the object in the detection range to obtain calibration information; and adjusting the position of the first substrate according to the calibration information.

23 Claims, 26 Drawing Sheets

(56) References Cited

U.S. PATENT DOCUMENTS

| | | | | |
|---|---|---|---|---|
| 8,562,778 | B2* | 10/2013 | Yamada | B65H 35/0013 |
| | | | | 156/230 |
| 9,283,636 | B2* | 3/2016 | Bieber | B29C 66/92445 |
| 10,504,767 | B2* | 12/2019 | Peterson | H01L 21/67132 |
| 11,062,927 | B2* | 7/2021 | Monser | H01L 21/67144 |
| 11,134,595 | B2* | 9/2021 | Hoefs | H01L 24/75 |
| 11,551,948 | B2* | 1/2023 | Chen | H01L 21/67751 |
| 11,973,054 | B2* | 4/2024 | Huang | B23K 1/0053 |
| 2022/0102189 | A1* | 3/2022 | Chew | H01L 21/682 |

* cited by examiner (a) (b)

(c) (d)

METHOD FOR TRANSFERRING OBJECTS AND TRANSFER APPARATUS USING THE SAME

RELATED APPLICATIONS

This application claims priority under 35 U.S.C. 119(e) to U.S. Provisional Patent Application No. 63/315,598, filed on Mar. 2, 2022, and further to Chinese Patent Applications No.: CN202110826938.9, filed on Jul. 21, 2021, the disclosure of each of which is incorporated in its entirety by reference herein.

TECHNICAL FIELD

The disclosed embodiments relate to the features of semiconductor manufacturing technology. More particularly, the disclosed embodiments describe various improvements in a method for transferring objects and a transfer apparatus using the same.

BACKGROUND

In the semiconductor manufacturing process, a transfer mechanism is used to select and classify the cutting dies according to their appearance, quality or characteristics. Currently, most transfer apparatuses use an ejector having an ejecting needle to transfer the dies from a thin film to a Printed Circuit Board (PCB). However, in the transfer process, due to the large area and elasticity of the thin film, the accurate alignment would be hardly achieved if the ejector ejects directly to the dies on the thin film, which makes the dies easily overturned or skewed, resulting in a low production yield.

SUMMARY

Therefore, the present disclosure provides a method for transferring objects and a transfer apparatus using the same to solve the above issues. The method and the transfer apparatus can achieve accurate alignment and avoid the overturning and skewing of the dies to enhance the production yield.

The present disclosure provides a method for transferring objects, which is adapted for transferring at least one object on a first substrate to a second substrate by an ejector. The method includes the following steps: controlling, during a first period, the ejector at an ejecting working position to perform an ejecting process along with a first direction, to transfer the object from the first substrate to the second substrate; controlling, during a second period, the ejector to move to an ejecting standby position along with a second direction which is non-parallel to the first direction, to expose at least one of the object on the first substrate to a detection range of an image capturing device; detecting the position of the object in the detection range to obtain calibration information; and adjusting the position of the first substrate according to the calibration information.

The present disclosure further provides a transfer apparatus, which is adapted for transferring at least one object from a first substrate to a second substrate. The transfer apparatus includes a movable placement device, a pressing member, and an ejector. The movable placement device is configured to place the first and second substrates on the first and second bearing areas, respectively. The first substrate and the second substrate face each other with a gap and can shift relatively. The pressing member is movably disposed on a side of the first bearing area away from the second bearing area and configured to press the first substrate along with a preset movement direction, so that a mounting area of the object to be ejected on the first substrate closes to the second substrate, wherein the preset movement direction is the direction of the first bearing area towards the second bearing area. The ejector is movably disposed on the side of the first bearing area away from the second bearing area and includes an ejecting member configured to eject, by its front-end, the object along with the preset movement direction and passing through the pressing member. The pressing member includes a sidewall having a first notch at the side away from the first bearing area, and the first notch is configured to allow the ejector to pass through while moving.

In an embodiment of the present disclosure, a second notch is formed on a side of the pressing member close to the first bearing area.

In an embodiment of the present disclosure, the pressing member further includes a pressing ring and a mounting member. The pressing ring defines the shape of the second notch. The mounting member and the pressing ring are oppositely disposed from each other, and at both sides of the sidewall respectively.

In an embodiment of the present disclosure, a rounding chamfer is formed at the joint between the bottom surface and the side surface of the pressing ring.

In an embodiment of the present disclosure, the second notch is a circular hole.

In an embodiment of the present disclosure, a perforation is further formed on the sidewall, and the perforation is oppositely disposed from the first notch.

The transfer apparatus further includes an image capturing device fixedly disposed on a side of the first bearing area away from the second substrate, and the image capturing device is configured to take an image of the object to be ejected.

In an embodiment of the present disclosure, when the ejector ejects the object, the relative position of the ejector, the pressing member, and the image capturing device are coaxial.

In an embodiment of the present disclosure, the ejector includes an ejecting cap, in which the ejecting member can protrude the ejecting cap.

In an embodiment of the present disclosure, the movable placement device includes a first placement part and a second placement part. The first placement part and the second placement part are oppositely disposed of each other with a gap and capable of relatively shifting.

Compared to the prior arts, the mounting area of the object to be ejected on the first substrate can come closer to the second substrate when ejecting the object by using the pressing member to press the first substrate so that the tension of the mounting area of the object to be ejected can be easily controlled. In addition, by adjusting the distance between the mounting area, of the object to be ejected on the first substrate, and the second substrate, the ejector can eject the object precisely so as to avoid the occurrence of die overturning or skew, and a high yield can be also achieved.

DESCRIPTION OF DRAWINGS

In order to explain more clearly the technical solution in the present embodiment, the following is a brief introduction to the drawings described in the embodiments. Obviously, the drawings described below are only some embodiments of the present application. For the person having ordinary skills in the art, other drawings can be obtained from these drawings without any creative effort.

DETAILED DESCRIPTION

Figure 1:
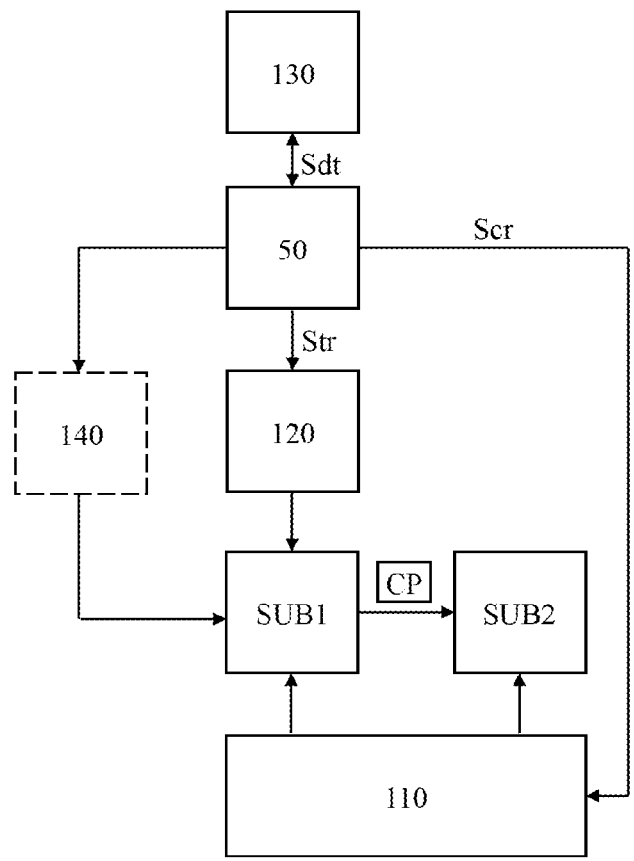
FIG. 1 is a schematic functional block diagram of a transfer apparatus according to some embodiments of the present disclosure.

The present disclosure provides a novel method for transferring objects and a transfer apparatus using the same to solve the issue brought up in the background. In order to further clarify the inventive features and advantages of the present disclosure, the present disclosure will now be described in the following embodiments with reference to the drawings. The following descriptions of various embodiments of this invention are presented herein for purpose of illustration and giving examples only. It is not intended to be exhaustive or to be limited to the precise form disclosed. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of components may be exaggerated for clarity. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers, or steps, these elements, components, regions, layers, and/or steps should not be limited by these terms. Unless the context indicates otherwise, these terms are only used to distinguish one element, component, region, layer, or step from another element, component, region, or step, for example as a naming convention. Thus, a first element, component, region, layer, or step discussed below in one section of the specification could be termed a second element, component, region, layer, or step in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to direct connection (i.e., touching) unless the context indicates otherwise.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein are interpreted accordingly.

FIG. 1 is a schematic functional block diagram of a transfer apparatus according to some embodiments of the present disclosure. Referring to FIG. 1, the transfer apparatus 100 is configured to transfer at least one object CP on the first substrate SUB1 to the second substrate SUB2. The object CP to be transferred could be any kind of electronic component of small size such as a die. For a specific example, the object CP could be Mini LED or Micro LED, but the invention is not limited thereto. The transfer apparatus 100 can also be used to transfer other types of objects in the different embodying scenarios. In some embodiments, the first substrate SUB1 can be an elastic film substrate that is flexible and can carry the objects or allow the objects to attach on; and second substrate SUB2 is, for example, the printed circuit board (PCB), but the present invention is not limited thereto. The transfer apparatus 100 of the present embodiment includes a controller 50, a carrier assembly 110, a transfer assembly 120, and a detection module 130.

The controller 50 is coupled to the carrier assembly 110, the transfer assembly 120, and the detection module 130 of the transfer apparatus 100 and configured to control the operation of the carrier assembly 110, the transfer assembly 120, and the detection module 130 according to the received signal, commend, and/or setting value.

In some embodiments, the controller 50 can be implemented by hardware, firmware, or software, it's not necessary to be set physically inside of the transfer apparatus 100.

The carrier assembly 110 is configured to carry the first substrate SUB1 and the second substrate SUB2, and to adjust the relative position of the first substrate SUB1 and the second substrate SUB2 by moving at least one of the first substrate SUB1 and the second substrate SUB2, so that the object CP on the first substrate SUB1 can be aligned to the corresponding transferring area on the second substrate SUB2.

In some embodiments, the carrier assembly 110 is, for example, a movable placement device including a plurality of platforms configured to carry the first substrate SUB1 and the second substrate SUB2, respectively. The platforms of the movable placement device can be moved on the corresponding working planes in response to the control of the controller 50, so as to change the relative position between the first substrate SUB1 and the second substrate SUB2.

The transfer assembly 120 is configured to apply the acting force to the object CP on the first substrate SUB1 so that the object CP is transferred to the corresponding transferring area on the second substrate SUB2 in response to the applied acting force.

In some embodiments, the transfer assembly 120 can be implemented by a non-contact transfer apparatus, which applies non-contact force to the object CP for transferring, for example, a laser transfer apparatus, an electrostatic transfer apparatus, a heat transfer apparatus, and so on. In some embodiments, the transfer assembly 120 can also be implemented by a contact transfer apparatus, which applies contact force to the object CP for transferring, for example, an ejecting apparatus.

The detection module 130 is configured to detect the information of the relative position between the object CP and the second substrate and generate a corresponding detection signal Sdt transmitting to the controller 50. The controller 50 can calculate the displacement compensation value of the object CP and the corresponding transferring area according to the detection signal and generate, according to the displacement compensation value, a calibration signal Scr transmitting to the carrier assembly 110, so that the carrier assembly 110 can adjust the relative position of the first substrate SUB1 and the second substrate SUB2 according to the calibration signal Scr.

In some embodiments, the detection module 130 can be implemented by one or a plurality of image capturing devices. The image capturing device(s) is disposed corresponding to the position of the object CP for capturing images without additional specific limitations on how to implement it or where should it be physically located. For example, the image capturing device(s) can be implemented by a charge-coupled device (CCD) image sensor, a complementary metal-oxide-semiconductor (CMOS) image sensor, or an industrial camera, the present invention is not limited thereto.

In some embodiments, the transfer apparatus 100 further includes the tension-holding assembly 140. The tension-holding assembly 140 is configured to apply a stabilizing force at a specific area (or a tension-holding area) on the first substrate SUB1 so as to increase the tension of the specific area, so that the tension of the specific area is higher than the surrounding area. Therefore, it can be observed that, during the period of applying the stabilizing force by the tension-holding assembly 140, the shortest distance between the specific area and the second substrate will be less than that between the surrounding area and the second substrate SUB2. Since the tension-holding area on the first substrate SUB1 has a higher tension than the surrounding area, the tension variation, caused by the application of the acting force for transferring the object CP within the tension-holding area, would not substantially affect the surrounding area of the first substrate SUB1. In addition, because the distance between the object CP in the tension-holding area and the second substrate SUB2 is shortened, the object CP can be transferred with a smaller displacement which also causes smaller tension variation. Therefore, the skew and/or mismatch of the surrounding objects CP, caused by the tension variation which makes the surrounding objects cannot be transferred to the second substrate SUB2 correctly, could be avoided.

It can be noted that, in the embodiments of using the contact transfer apparatus as the transfer assembly 120, the tension-holding assembly 140 can be designed as a structure capable of applying contact force to the area around the tension-holding area, or a notch structure allowing the transfer assembly 120 passing through, so as to prevent the transfer assembly 120 and the tension-holding assembly 140 interfere with each other when the acting force is applied. The notch structure can be a closed notch, for example, a circular notch, a rectangular notch, etc. In some embodiments, the notch structure can be an open notch, for example, a C-shaped notch, a U-shaped notch, etc. From another point of view, although the notch structure is usually implemented by the circular notch or other closed notch structures in some embodiments, the notch could have one or more slots or openings at the edge which form an open notch. Taking the notch having one opening at the edge as an example, the notch will be a C-shaped notch. Of course, the notch could be in a different shape in different embodiments, the present invention is not limited thereto. The specific structural embodiments of the tension-holding assembly 140 will be further described later in the present disclosure.

FIGS. 2A to 2E are used to further illustrate the configurations of the transfer apparatus 100 of the present disclosure in different embodiments, where FIGS. 2A-2E are schematic diagrams of a transfer apparatus according to some embodiments of the present disclosure.

Figure 2A:
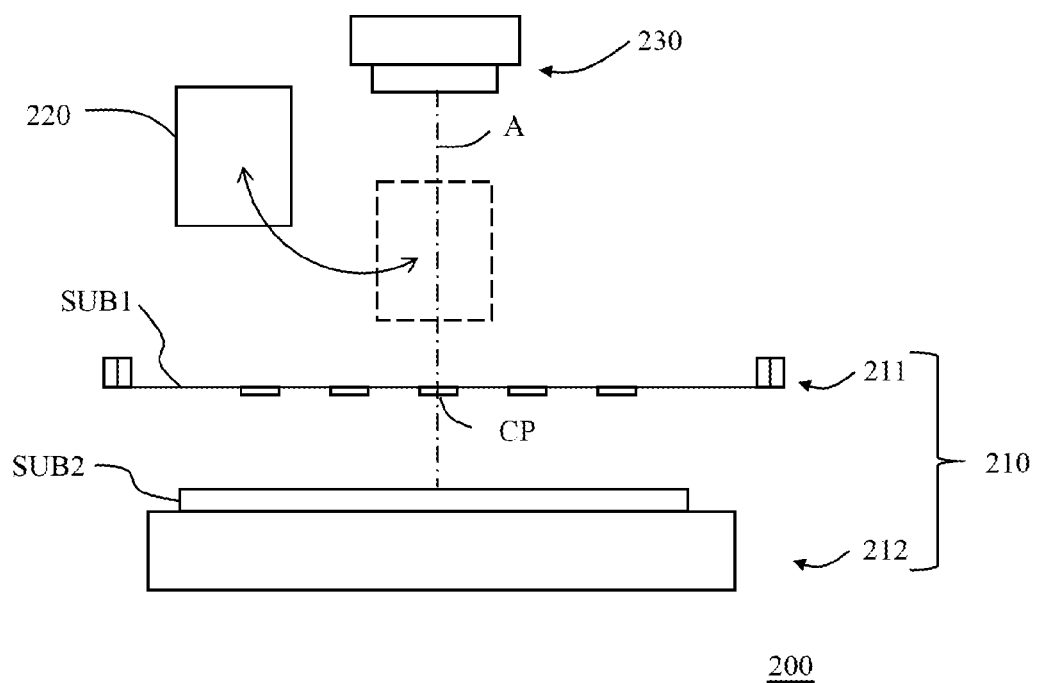
FIGS. 2A-2E are schematic diagrams of a transfer apparatus according to some embodiments of the present disclosure.

Referring to FIG. 2A, the transfer apparatus 200 of the present embodiment includes a carrier assembly 210, a transfer assembly 220, and a detection module 230, in which the carrier assembly 210 in the present embodiment can be a movable placement device (hereinafter "movable placement device 210"), the transfer assembly 220 in the present embodiment can be an ejector configured to apply contact force to transfer the objects (hereinafter "ejector 220"), and the detection module 230 in the present embodiment can be an image capturing device (hereinafter "image capturing device 230"), but the present invention is not limited thereto. In addition, the first substrate SUB1 of the present embodiment takes the blue tape as an example for explanation. The second substrate SUB2 can be a printed circuit board (PCB)

having an adhesive layer, for example, implemented by glue. The objects are attached to a side of the first substrate SUB1 facing the second substrate SUB2, that is, the objects on the first substrate SUB1 are physically disposed between the first substrate SUB1 and the second substrate SUB2.

In the present embodiment, the movable placement device 210 includes a first platform 211 configured to carry the first substrate SUB1 and a second platform 212 configured to carry the second substrate SUB2. The first platform 211 and the second platform 212 can be oppositely disposed of each other with a gap and are capable of relatively moving, so that the first substrate SUB1 and the second substrate SUB2 can be moved relatively and a predetermined interval between the first substrate SUB1 and the second substrate SUB2 can be maintained when the first substrate SUB1 and the second substrate SUB2 are carried by the movable placement device 210. In some embodiments, the interval between the first substrate SUB1 and the second substrate SUB2 is, for example, equal to or more than 1.5 mm.

In some embodiments, the first platform 211 includes a expand ring which fixes/holds the first substrate SUB1. To be specific, the expand ring can be used to stretch the periphery of the first substrate SUB1 to reduce the viscosity of the first substrate SUB1, so that the objects CP can be transferred easier in the following process. It should be noted that, the first substrate SUB1 can be stretched and fixed by different mechanisms in different embodiments, the present invention is not limited thereto.

The ejector 220 is disposed corresponding to the position of the first platform 211 and the second platform 212, so that when the ejector 220 performs the ejecting process, the ejector 220 can apply thrust to the object CP in the direction toward the second substrate SUB2 to move the object CP from the first substrate SUB1 to the second substrate SUB2.

The ejector 220 of the present embodiment is configured to have the multi-directional movement with a specific moving trajectory. In other words, the ejector 220 can be controlled to move along a specific trajectory, in which the specific trajectory can be a set of coordinates variation in any axial direction of the three-dimensional coordinate system. To be more specific, a traditional ejector can merely be reciprocated in a single axial direction, which means the traditional ejector can only move toward or away from the first substrate along the axis A if referring to the figures. On the contrary, the ejector 220 of the present embodiment can not only move along the axis A to perform the ejecting process, but also along a direction, which is non-parallel to the axis A, by the specific trajectory.

The image capturing device 230 is configured to capture an image of the object CP and transmit the captured image to the controller (not shown) to calculate the position deviation between the object CP and the ejecting position, so that the movable placement device 210 can calibrate the position of the objects to align the ejecting position by shifting the first platform 211 before the ejector 220 performing the ejecting process. In the present embodiment, the image capturing device 230 is disposed above the movable placement device 210 and the ejector 220 and configured to capture the image downward towards to the first substrate SUB1. In other words, in the present embodiments, the image capturing device 230, the ejector 220, and the movable placement device 230 are sequentially disposed from top to bottom. From another perspective, it can be understood that the ejector 220 and the image capturing device 230 are disposed at one side of the first platform 211, and the second platform 212 is disposed at the opposite side of the first platform 211, but the present invention is not limited thereto. In some another embodiments, the ejector 220 and the image capturing device 230 can be disposed at different sides, as long as the image capturing device 230 can properly capture the image of the object CP. In addition, in the present embodiment, the image capturing device 230 captures, directly and facing toward, the image of the object CP. That is, the capture direction of the image capturing device 230 is orthogonal to the working plane of the first substrate SUB1. From FIGS. 2A to 2E, the capture direction of the image capturing device 230 is the direction towards the substrate along with the axis A, and thus the axis A could be also known as an image capture axis of the image capturing device 230.

To be specific, the ejector 220 moves to the ejecting standby position (depicted in solid line, hereinafter "ESP") before ejecting the object CP, and then moves to the ejecting working position (depicted in dotted line, hereinafter "EWP") when performing the ejection. After a single ejecting process is complete, the ejector 220 moves back to the ESP from the EWP, thus making a reciprocating movement. In the present embodiment, the object CP refers to any one of the objects carried by the first substrate SUB1, and the object CP to be ejected refers to the specific object, among the objects on the first substrate SUB1, that is located directly below the ejector 220 when the ejector 220 is at the EWP. In addition, in the present embodiment, the ESP refers to the preset initial position of the ejector 220, and the EWP refers to the position the ejector 220 performs the ejecting process.

It can be understood that, the ejector 220 is disposed to not affect the image capturing device 230 captures the image of the object CP when the ejector 220 is at the ESP. "Not affect" means that at least the image of the object CP used to calculate the position deviation is not obscured by the ejector 220. In other words, the ESP of the ejector 220 is not necessary to be completely out of the image capturing range of the image capturing device 230, the ESP can be any position that would not shield the object used to calculate the deviation in the image capturing range.

Since the ejector 220 has a configuration capable of moving back and forth between the ESP and the EWP, the ejector 220 can move outside of the image capturing range of the object CP before the image capturing device 230 captures the image, so that the image of the object CP can be easily captured without using additional optical reflection or multiple image capturing devices. In some embodiments, a coaxial arrangement among the image capturing device 230, the ejector 220 (at the EWP), and the movable placement device 210 can be achieved by using the above configuration of the ejector 220, so that the image capturing device 230 can have better image quality and avoid calibration errors.

Figure 2B:
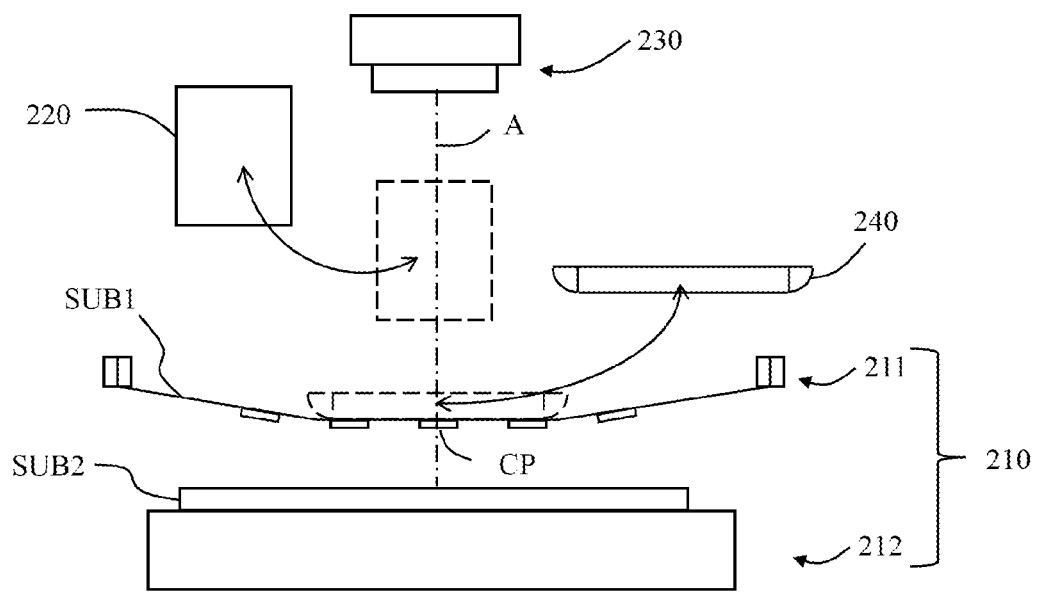

Referring to FIG. 2B, the transfer apparatus 300 of the present embodiment includes a movable placement device 210, an ejector 220, and an image capturing device 230. The transfer apparatus 300 of the present embodiment is similar to the embodiments mentioned above, except that the transfer apparatus 300 further includes a tension-holding assembly 240 implemented by a pressing member (hereinafter "pressing member 240"). The similar or identical parts can refer to the description of the above embodiments, which will not be repeated herein.

The pressing member 240 is configured to apply the pressing force, towards the second substrate SUB2, on the first substrate SUB1 to establish a tension-holding area having relatively high tension on the first substrate SUB1. The object CP to be ejected will be in the tension-holding area, and the image capturing device 230 can directly capture the image of the object CP in the tension-holding area when the ejector 220 moves to the ESP. In other words, the pressing member 240 would not interfere with the image capture of the object CP in the tension-holding area when the pressing member applies the pressing force on the first substrate SUB1.

When the transfer apparatus 300 starts to operate, the pressing member 240 will be moved to a pressing standby position and then controlled to move towards and press the first substrate SUB1 until the displacement of the pressing member 240 in its acting direction reaches a preset value (or until the distance between the pressed area and the second substrate SUB2 is reduced to a preset value), that is, a pressing working position is reached. It may create an area relatively closer, compared to the periphery area, to the second substrate SUB2, and this area is the tension-holding area.

During the operating process of the transfer apparatus 300, the pressing member 240 continues to press the first substrate SUB1 until all the objects CP on the first substrate SUB1 is transferred to the second substrate SUB2. To be specific, the ejector 220 moves to the EWP from the ESP to perform the ejecting process after the image of the object CP to be ejected has been captured by the image capturing device 230. The ejector 220 passes through the pressing member 240 to eject the object CP during the ejecting process. The ejector 220 returns to the ESP from the EWP after the ejecting process, so that the image capturing device 230 can capture the image for the next object CP to be ejected. The ejector 220 will move to the EWP from the ESP again to perform the ejecting process after the image of the next object CP to be ejected has been captured. The above process will be repeatedly performed, thus transferring the objects CP on the first substrate SUB1 to the second substrate SUB2.

In the present embodiment, the ejector 220, the image capturing device 230, and the pressing member 240 are disposed on the same side (relative to the first substrate SUB1) as an example. In other embodiments, the image capturing device 230 can be disposed on the different sides as long as the ejector 220 and the pressing member 240 are on the same side. In addition, in the present embodiment, the ejector 220 and the pressing member 240 are illustrated to be located on the different sides of the axis A in the figure for example, but the invention is not limited thereto. In other words, although the present embodiment shows the ESP and the pressing standby position are located on both sides of axis A, the ESP and the pressing standby position can be located on the same side of axis A in different embodiments.

In detail, when the ejector 220 ejects the objects CP on the first substrate SUB1 directly, the ejecting force will focus on the contact point of the first substrate SUB1, so that the tension variation affects the entire first substrate SUB1. Since the first substrate SUB1 has a relatively large area, the tension is difficult to control. Therefore, it is easy to cause the skew and/or mismatch of the objects CP on the first substrate SUB1 due to the tension variation and resulting in the reduction of transfer yield.

In contrast, the present embodiment provides a configuration of pressing the first substrate SUB1 by using the pressing member 240, so that the mounting area (i.e., the tension-holding area) of the object CP to be ejected on the first substrate SUB1 comes close to the second substrate SUB2 to maintain the distance between the tension-holding area and the second substrate SUB2 within a preset range, for example, less than or equal to 0.5 mm. Therefore, the distance between the first substrate SUB1 and the second substrate SUB2 can be effectively controlled. Because the displacement of the object CP is shortened during the ejecting process, the first substrate bears lower tension variation, which makes the position offset less likely to occur due to the tension variation. It should be noted that, the distance or spacing between the tension-holding area of the first substrate SUB1 and the second substrate SUB2 can be adjusted corresponding to the practical requirement, which is not limited to the disclosed embodiments.

Secondly, in the embodiments of utilizing an elastic film as the first substrate SUB1, the first substrate SUB1 is prone to generate position deviation gradually in the process of transfer based on different factors such as the processing time and the amount of the object CP remaining to be transferred. In the present embodiment, the first substrate SUB1 (at least in the tension-holding area) can be stably moved in the horizontal plane to avoid the above deviation issue.

Furthermore, since the tension in the tension-holding area is higher and more stable than the surrounding area, the tension variation is less likely to affect the area outside the tension-holding area when the ejecting process is performed.

The utilizing of the pressing member 240 can further resolve the issue that the first substrate SUB1 and the second substrate SUB2 are not completely parallel. For instance, assuming the first substrate SUB1 tilts to the right side when disposed on the first platform 211 so that the left side of the first substrate SUB1 is higher than the right side, the distance of the left side between the first substrate SUB1 and the second substrate SUB2 is greater than that of the right side. Therefore, even if the ejector 220 ejects the object CP at the same position with the same ejecting path, the ejecting result for each object CP could still be different, which means the displacement of each object CP could be different. In contrast, even if the first substrate SUB1 is not correctly placed as mentioned above, each object CP can be ensured to have substantially the same displacement during the ejecting process by utilizing the pressing member 240 to press the first substrate SUB1.

In the industrial applications, the image capturing device 230 normally does not have the function of autofocus because of the need for high-speed image capture. By utilizing the pressing member 240, the image capturing device 230 can take images quickly and clearly since the tension-holding area of the first substrate SUB1 can be maintained at a specific position by the pressing member 240, and thus the distance between the image capturing device 230 and the tension-holding area can be fixedly maintained at the focal length of the image capturing device 230.

In some embodiments, there may be a coaxial configuration between the pressing member 240 (at the pressing standby position/the pressing working position), the image capturing device 230, the ejector 220 (at the EWP), and the movable placement device 210.

Figure 2C:
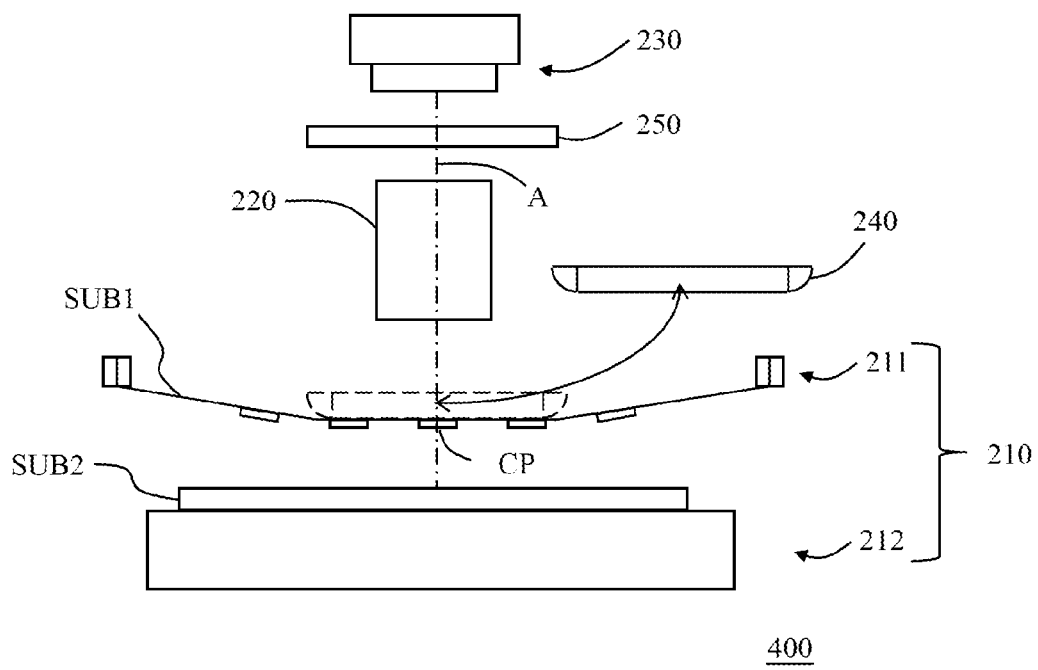

Referring to FIG. 2C, the transfer apparatus 400 of the present embodiment includes a movable placement device 210, an ejector 220, an image capturing device 230, a pressing member 240, and an optical module 250. The present embodiment is similar to that of the transfer apparatus 300, except that the ejector 220 of the transfer apparatus 400 is fixedly supported by the frame of the transfer apparatus and normally located at the EWP so that the ejector 220 can only move along with the axis A. In addition, the transfer apparatus 400 of the present embodiment further includes the optical module 250. The similar or identical parts can refer to the description of the above embodiments, which will not be repeated herein.

In the present embodiment, since the ejector 220 is fixedly disposed at the position that could interfere with the image capture of the image capturing device 230, the additional optical module 250 is configured to assist the image capturing device 230 to take accurate and clear images of the objects CP. The optical module 250 is, for example, disposed between the ejector 220 and the image capturing device 230. The image capturing device 230 captures the images of the first substrate SUB1 and the objects CP reflected by the optical module 250, so that the controller can calculate the position of the objects CP and then perform the calibration process. For instance, the optical module 250 can project the reflected light beams of the first substrate SUB1 and the objects CP onto the lens of the image capturing device 230 by means of refraction and/or reflection so that the image capturing device 230 may obtain images of the first substrate SUB1 and the objects CP.

Figure 2D:
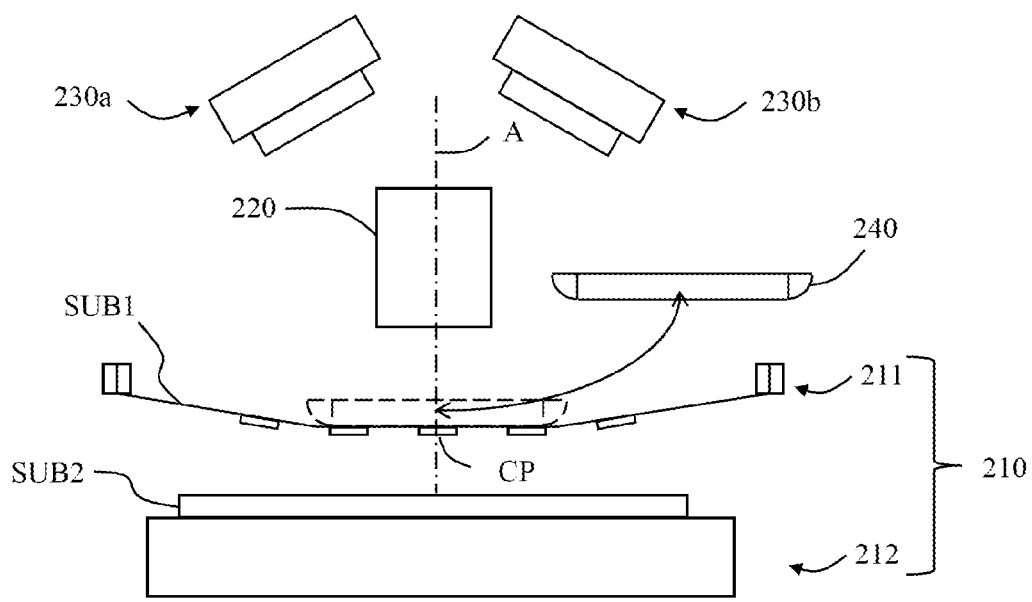

Referring to FIG. 2D, the transfer apparatus 500 of the present embodiment includes a movable placement device 210, an ejector 220, image capturing devices 230a and 230b, and a pressing member 240. The present embodiment is similar to that of the transfer apparatus 400, except that the transfer apparatus 500 of the present embodiment utilizes a plurality of image capturing devices 230a and 230b to implement the image capture of the objects CP rather than the optical module. The similar or identical parts can refer to the description of the above embodiments, which will not be repeated herein.

In the present embodiment, the image capturing devices 230a and 230b are, for example, symmetrically disposed on both sides of the axis A to capture images towards the first substrate SUB1, so as to avoid the position that is blocked by the ejector 220. The controller can calculate the position of the objects CP according to the image information captured by the image capturing devices 230a and 230b and perform the subsequent calibration process. In some embodiments, the image capturing devices 230a and 230b can be arranged asymmetrically, as long as the images captured by the image capturing devices 230a and 230b can be used for calculating the position information of the object CP. The present invention is not limited thereto.

Figure 2E:
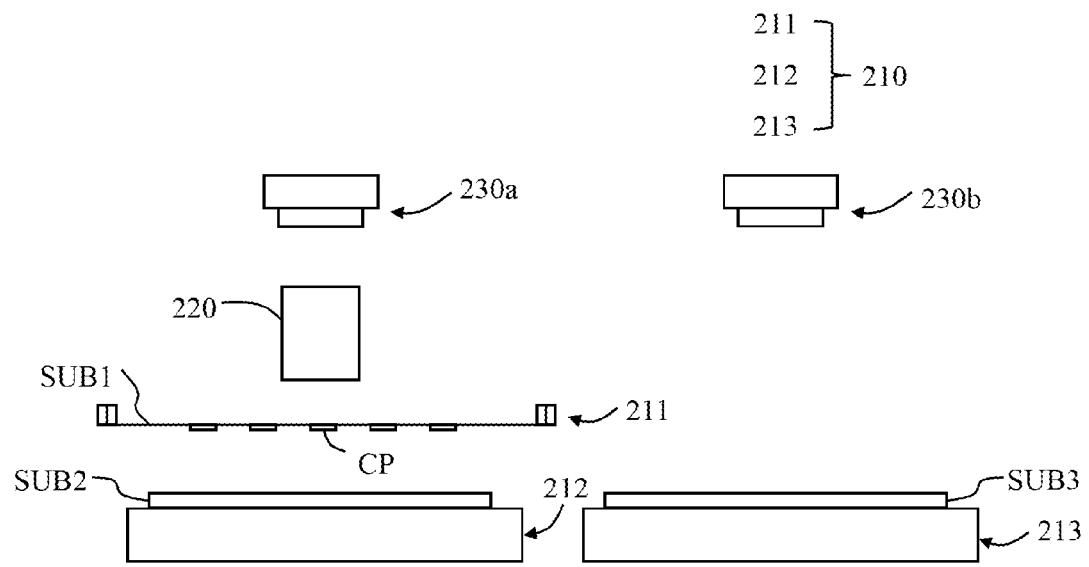

Referring to FIG. 2E, the transfer apparatus 600 of the present embodiment includes a movable placement device 210, an ejector 220, and image capturing devices 230a and 230b. In the transfer apparatus 600 of the present embodiment, the configuration of the ejector 220 and related description can refer to the configurations described in FIGS. 2A to 2D. In other words, the ejector 220 of the present embodiment can be configured to have the ability to move in multi-directions (as described in the embodiments of FIGS. 2A and 2B) or to be fixedly supported by the frame and normally located at the EWP (as described in the embodiments of FIGS. 2C and 2D). If the ejector 220 is configured to be fixedly supported by the frame and normally located at the EWP, the transfer apparatus 600 may further include an optical module (as shown in FIG. 2C) or an additional image capturing device (as shown in FIG. 2D) to assist the image capture of the objects CP. The similar or identical parts can refer to the description of the above embodiments, which will not be repeated herein.

The main difference between the present embodiment and the aforementioned embodiments is that the transfer apparatus 600 may implement the function of substrate pre-scan by utilizing a specific configuration of the movable placement device and the image capturing device. To be specific, in the present embodiment, in addition to the first platform 211 and the second platform 212, the movable placement device 210 further includes a third platform 213 configured to carry a third substrate SUB3. On the other hand, in addition to the image capturing device 230a, the transfer apparatus 600 further includes an image capturing device 230b configured to capture the image of the third substrate SUB3.

In the present embodiment, during the objects CP transfer between the first substrate SUB1 and the second substrate SUB2 by the transfer apparatus 600, the image capturing device 230b pre-scans the third substrate SUB3, that is, the image information of the third substrate SUB3 will be obtained before the third substrate SUB3 is used to receive the transferred objects CP to define the location for each transferring area. Therefore, when the transferring of the second substrate SUB2 is complete, the second substrate SUB2 can be moved out of the second platform 212, and the third substrate SUB3 can be placed on the second platform 212, so that the ejector 220 can continuously perform the transfer process, without interrupting, to transfer the objects CP onto the third substrate SUB3.

To be specific, when replacing the substrate to be transferred, it is usually necessary to scan and locate the new substrate with the image capturing device 230 in the general ejecting transfer process. The transfer process will be interrupted until the scan for the new substrate is complete. In addition, when scanning to locate the new substrate, the first platform 211 and the ejector 220 may need to be removed from the image capturing range of the image capturing device 230a to make the image capturing device 230 captures a complete and clear substrate image for locating. This takes a lot of time and hinders the smoothness of the overall process, which seriously affects the efficiency of the transfer apparatus.

By utilizing the configuration of the present embodiment, since the third substrate SUB3 has been scanned and located during the transfer process of the second substrate SUB2, the image capturing device 230a does not need to relocate the third substrate SUB3 after the transferring of the second substrate SUB2 is complete. Instead, the transfer process can continue, without being interrupted by the scan process, immediately after the third substrate SUB3 is placed on the second platform 212. Therefore, the transfer efficiency of the transfer apparatus 600 can be effectively improved.

In some embodiments, the third platform 213 and the second platform 212 are disposed in parallel so that the third substrate SUB3 and the second substrate SUB2 can be placed on the same working plane. This allows the third substrate SUB3 can be transported on the same working plane, thus avoiding possible position offset caused by the movement.

In some embodiments, the movable placement device 210 further includes a conveyor (not shown) disposed between the second platform 212 and the third platform 213, and the conveyor is configured to transport the third substrate SUB3 onto the second platform 212.

In some embodiments, the third platform 213 is configured to be movable. When the object transferring of the second substrate SUB2 is complete, the second platform 212 takes the second substrate SUB2 to leave the original working position, and then the third platform 213 takes the third substrate SUB3 to move to the original position of the second platform 212, so as to continue the transfer process. At this moment, the third platform SUB3 and the third substrate 213 can be respectively regarded as the second platform SUB2 and the second substrate 212 in the previous state.

It should be noted that, although not shown in the present embodiment, the pressing member 240 described in the aforementioned embodiments can also be utilized in the transfer apparatus 600 of the present embodiment and bring the same or similar beneficial effects.

Figure 3:
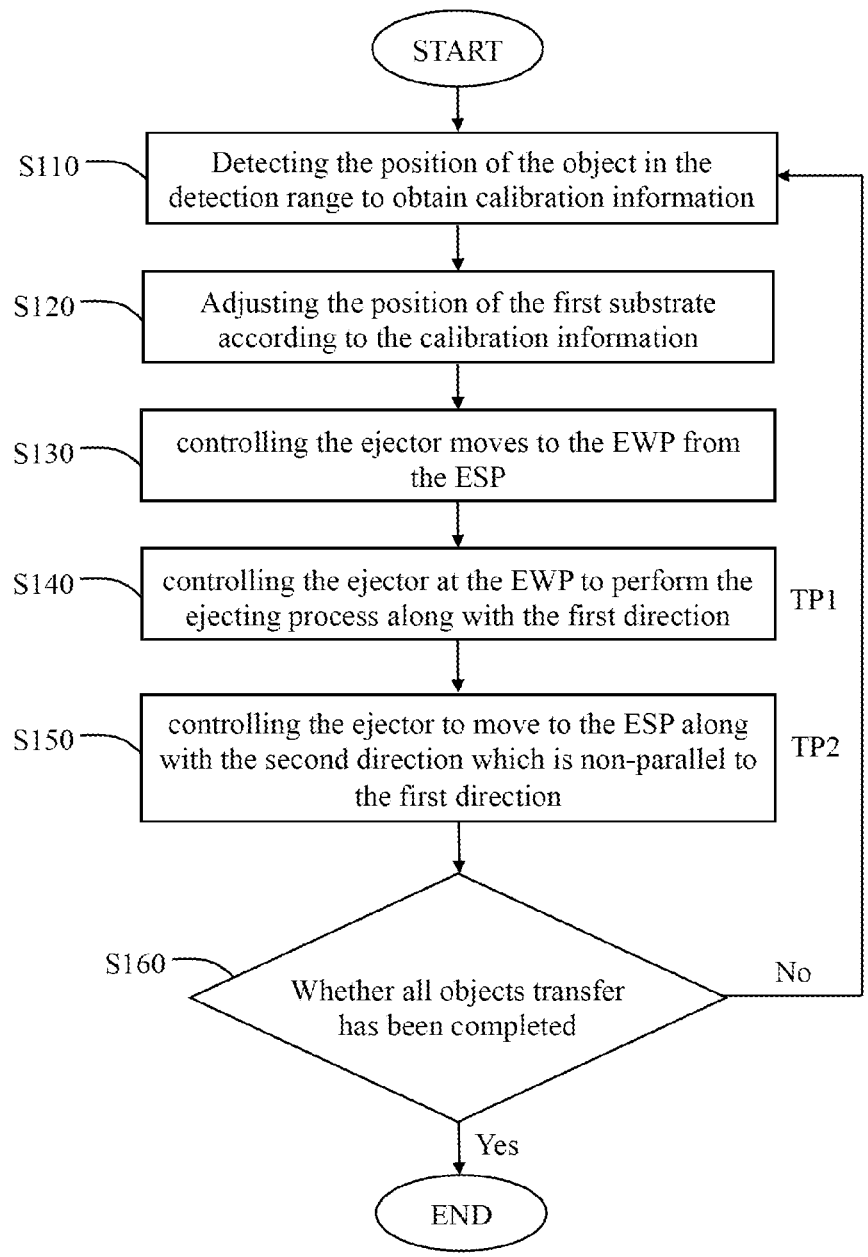
FIG. 3 is a flow chart of a method for transferring objects according to some embodiments of the present disclosure.
Figure 4A:
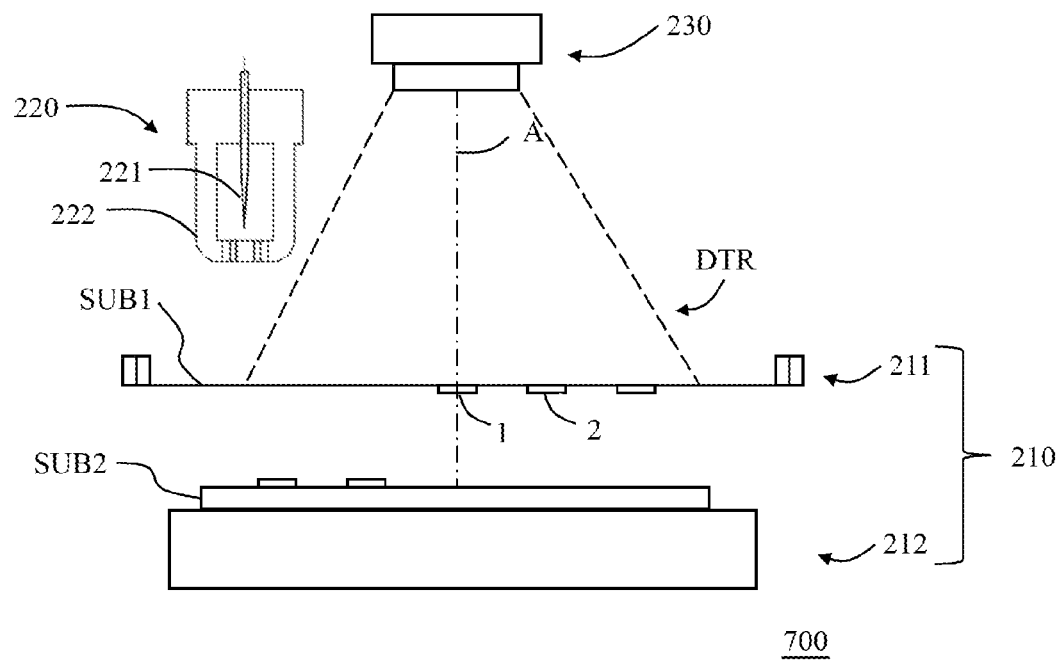
FIGS. 4A-4E are schematic diagrams of the transfer process according to some embodiments of FIG. 3.
Figure 4B:
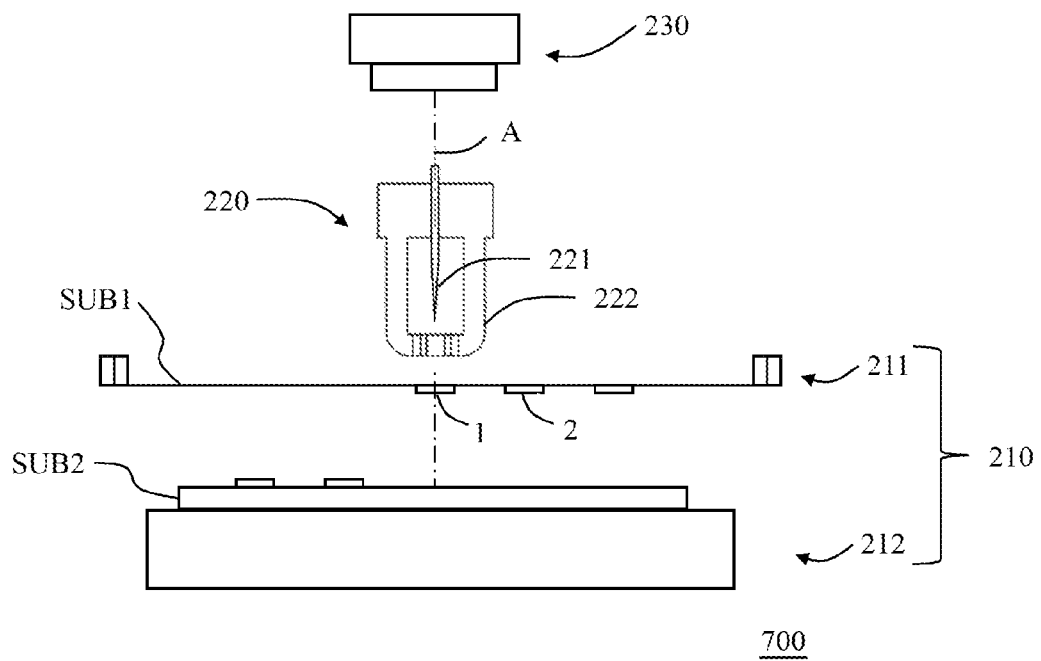
Figure 4C:
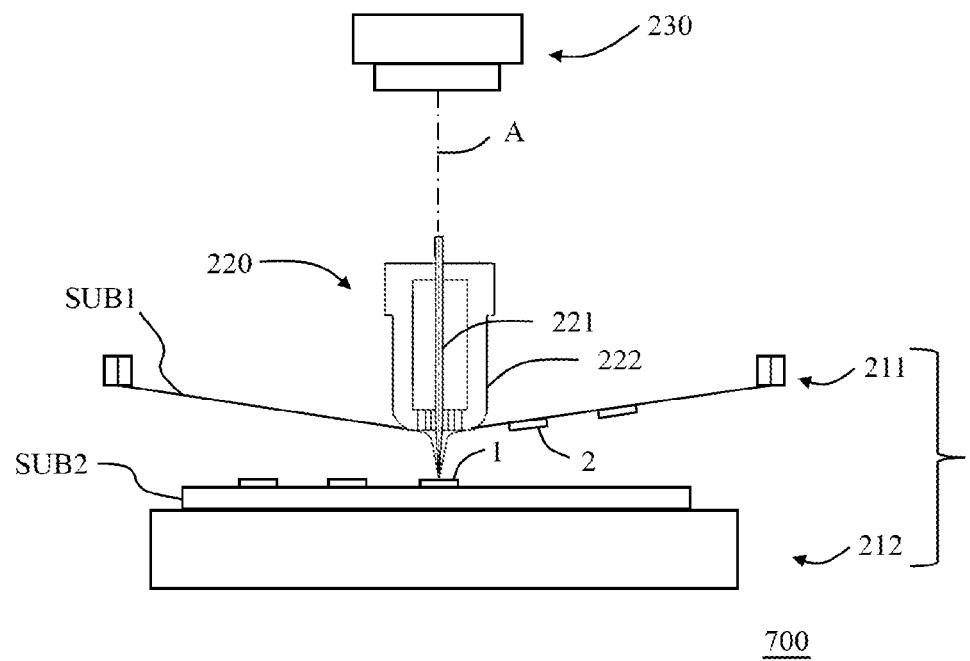
Figure 4D:
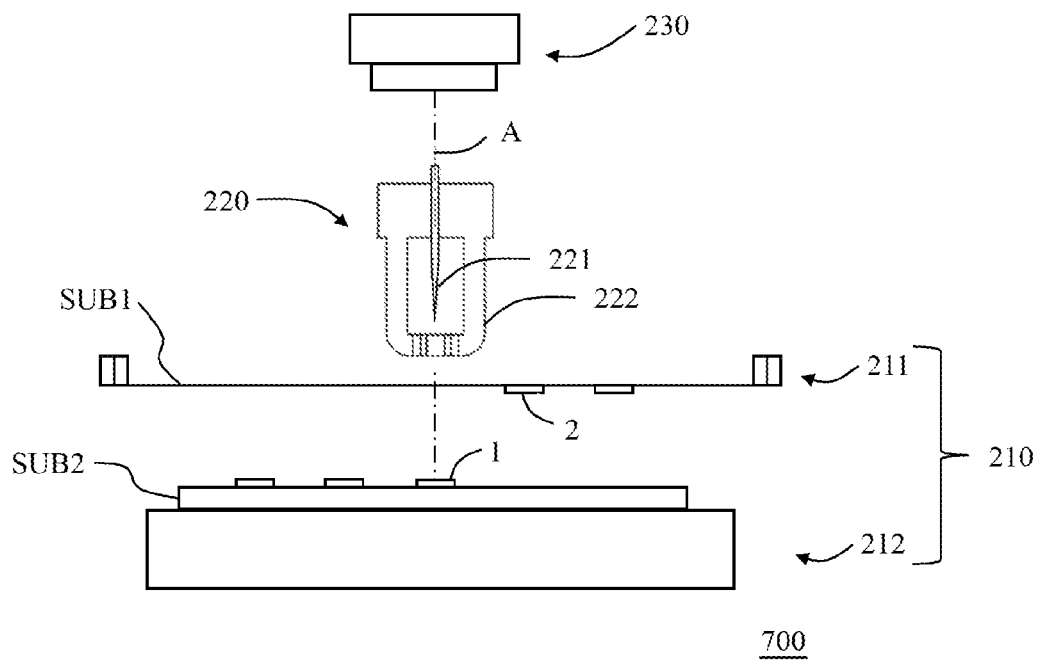
Figure 4E:
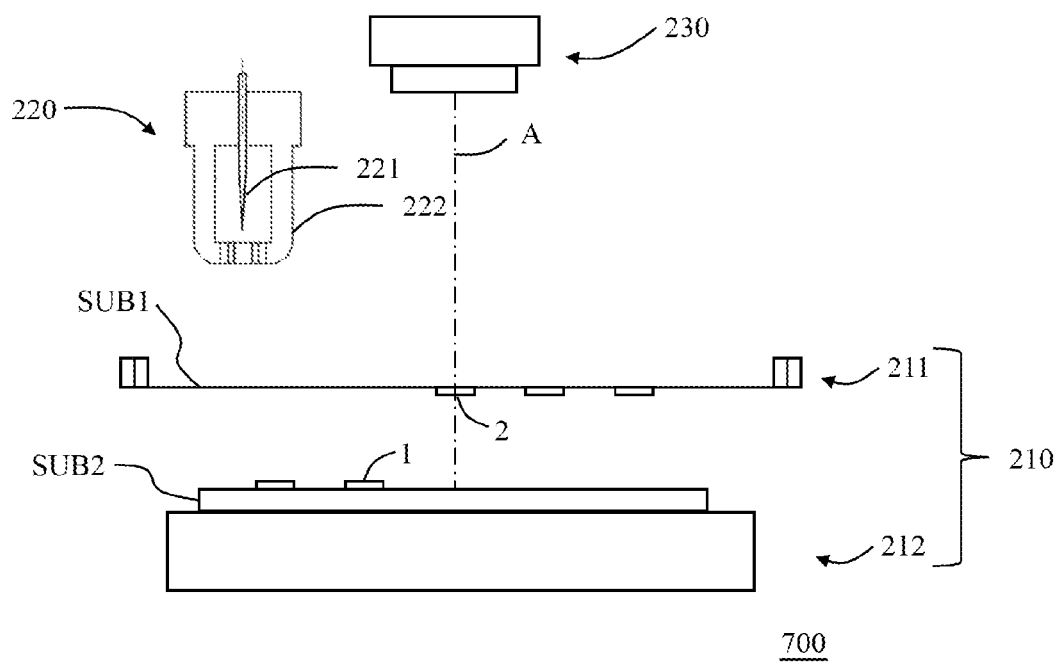

FIGS. 3 to 4E are used below to further illustrate the control method of the transfer apparatus of the present disclosure, where FIG. 3 is a flow chart of a method for transferring objects according to some embodiments of the present disclosure, and FIGS. 4A-4E are schematic diagrams of the transfer process according to some embodiments of FIG. 3.

In order to make the description clearer, the method of the present embodiment is illustrated based on the configuration of the transfer apparatus 700 shown in FIGS. 4A to 4E, which is similar/identical to that of the transfer apparatus 200 shown in FIG. 2A, so the description of each component can refer to the aforementioned embodiments, but the method described herein is not limited thereto. In addition, the preparation and placement of the objects in the present disclosure can be performed by using any workable prior arts and will not be described herein.

Referring to FIG. 3 and FIG. 4A, the present embodiment takes LED dies (e.g., LED dies 1 and 2) as an example of the objects, but the present invention is not limited thereto. In addition, in order to further clarify the whole ejecting process, the ejector 220 of the present embodiment includes, for example, an ejecting member 221 and an ejecting cap 222, in which the ejecting member 221 is capable of protruding outward the ejecting cap 222 and configured to eject, by its front-end, the LED die 1 along with the axis A and towards the first substrate SUB1.

First, the first substrate SUB1 having the dies and the second substrate SUB2 are respectively disposed on the first platform 211 and the second platform 212, in which a side of the first substrate SUB1 contacting the dies is towards the second substrate SUB2, so that the dies are between the first substrate SUB1 and the second substrate SUB2. In the beginning, the ejector 220 is at the ESP. After the first substrate SUB1 and the second substrate SUB2 have been correctly set up, the image capturing device 230 detects the position of the dies in the detection range DTR to obtain calibration information (step S110). The detection range DTR could be the entire image capturing range of the image capturing device 230, or a portion of the entire image capturing range which includes the images of the dies 1 and 2 to be calibrated, the present invention is not limited thereto. In addition, in some embodiments, the controller can calculate the calibration information based on, for example, the position information of the dies 1 and 2 obtained by the image capturing device 230.

After the calibration information has been calculated, the controller may adjust the position of the first platform 211 according to the calibration information to align the die 1 to be ejected with the transferring area on the second substrate SUB2 (step S120). The steps for calibration will be further described in the following embodiment of FIG. 5.

As shown in FIG. 4B, the ejector 220 at the ESP will be moved from the ESP to the EWP when receiving the instruction for executing the ejecting process (step S130).

Next, as shown in FIG. 4C, the ejector 220 at the EWP is controlled to perform the ejecting process along with a first direction (step S140). In the present embodiment, the first direction is the direction along with the axis A and down towards the first substrate SUB1. In the ejecting process, the ejecting member 221 and the ejecting cap 222 will move downwards simultaneously for a distance, and then the ejecting cap 222 stops moving and the ejecting member 221 continues to move downwards, so that the moving ejecting member 221 protrudes outward the ejecting cap 222 to push the die 1 moving towards the second substrate SUB2 until the die 1 attaches to the second substrate SUB2. The ejecting member 221 will then move back and retract inside the ejecting cap 222, and both the ejecting member 221 and the ejecting cap 222 move upwards to return to the EWP, as shown in FIG. 4D.

It should be noted that, in the case of the ejecting member 221 ejecting the die 1 without puncturing the first substrate SUB1, the viscosity of the first substrate SUB1 may be reduced due to the stretching of the surface of the first substrate SUB1, so that the die 1 can easily disengage from the first substrate SUB1 and attach to the second substrate SUB2.

After the step S140, as shown in FIG. 4E, the ejector 220 is controlled to move from the EWP to the ESP along with a second direction that is not parallel to the first direction (step S150). On the other hand, the first platform 211 and the second platform 212 will shift the first substrate SUB1 and the second substrate SUB2 respectively according to the calibration information, so that the next die 2 to be ejected will move to the axis A to align with the next transferring area on the second substrate SUB2, and thus the transfer process for the die 1 is completed. Depending on the driving design of the ejector 220, the specific trajectory formed by moving the ejector 220 along with the second direction may be straight, curved, or other shaped trajectories. It should be noted that, the second direction forming the specific trajectory can be regarded as to be non-parallel to the first direction as long as the tangent direction of the specific trajectory at any moment is not parallel to the first direction. In other words, if a trajectory forming by the first direction is a straight line, the second direction forming the specific trajectory is not parallel to the first direction as long as the specific trajectory is not a straight line exactly parallel to that forming from the first direction.

The controller then determines whether all die transfer has been completed (step S160). If it is determined to be no, the process will go back to step S110 to eject the next die. If yes, the transfer process ends.

It should be noted that, although the steps S120 and S130 are performed sequentially in the flow chart of the present embodiment, the present invention is not limited to that. In some embodiments, the transfer apparatus may also adjust the position of the first substrate while moving the ejector. That is, the steps S120 and S130 can be performed simultaneously.

It should also be noted that, with the assistance of an initial substrate in the pre-processing step, the luminous surface of each die can attach to the bearing surface of the first substrate SUB1. Thus, when the dies are transferred from the first substrate SUB1 to the second substrate SUB2, the luminous surface of the die will be located on the side away from the setting surface of the second substrate SUB2 and exposed outwardly. In addition, since the dies are transferred from the initial substrate to reversely attach to the first substrate SUB1, the position of each die on the first substrate SUB1 could be mirror reflected based on that on the initial substrate. Therefore, the control software can be correspondingly adjusted to process with the reversed position according to the initial position information of the dies before dies transfer.

Figure 5:
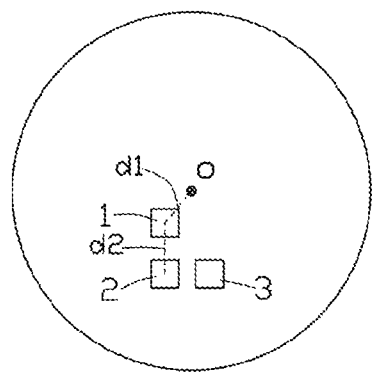
FIG. 5 is a schematic diagram of the objects being moved and transferred during the transfer process according to some embodiments of the present disclosure.
Figure 5:
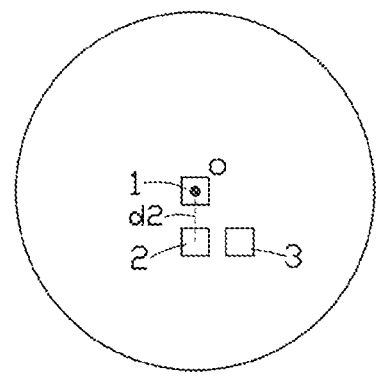
Figure 5:
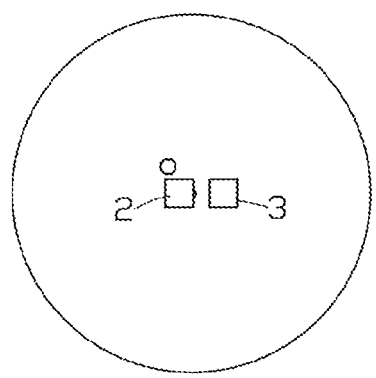
Figure 5:
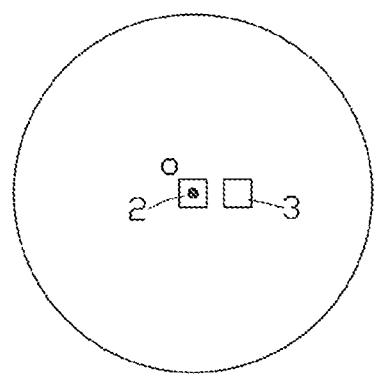

The calibration process for the die's position is further illustrated in FIG. 5 below, in which FIG. 5 is a schematic diagram of the objects being moved and transferred during the transfer process according to some embodiments of the present disclosure.

Referring to FIGS. 4A to 4E and FIG. 5, first of all, as shown in the state (a) of FIG. 5, which refers to the first action stage, the image capturing device 230 captures the image and sends the image information back to the controller, so that the controller can calculate the position deviation d1 between the die 1 and the ejecting position O and the position deviation d2 between the die 1 and the die 2 according to the received image information. In the present embodiment, the ejecting position O is fixed, the position deviation d1 refers to the distance between the center of the die 1 and the ejecting position O, and the position deviation d2 refers to the distance between the center of the die 1 and the center of the die 2. The position deviation d2 can also be known as the pitch of the dies 1 and 2.

As shown in the state (b) of FIG. 5, which refers to the second action stage, the controller can control the movement of the first platform 211 according to the position deviation d1, so that the die 1 is moved to the ejecting position O. It can be understood that moving the die 1 to the ejecting position O means that the first substrate SUB1 is moved by controlling the first platform 211, so that the center of the die 1 overlaps with the ejecting position O. After the die 1 is moved to the ejecting position O, the ejector 220, which is moved from the ESP to the EWP, performs ejecting process to push the die 1 in the third action stage to transfer the die 1 from the first substrate SUB1 to the second substrate SUB2. The third action stage cannot be shown in the state (b) because the die 1 moves in the vertical direction, which can be referred to as the state shown in the embodiment of FIG. 4C.

Then, in the fourth action stage as shown in the state (c) of FIG. 5, the first platform 211 moves, according to the position deviation d2, so that the die 2 is moved to the ejecting position O after the die 1 has been ejected to attach to the second substrate SUB2. However, no matter whether the first substrate SUB1 is punctured or not, the tension or other characteristics of the first substrate SUB1 may change after the ejector 220 ejects the die 1, and the positions of other dies (e.g., the dies 2 and 3) on the first substrate SUB1 may change. Therefore, moving the die 2 solely based on the position deviation d2 may not be able to accurately move the die 2 to the ejecting position O. As shown in the state (c), when moving the die 2 solely based on the position deviation d2, the center of the die 2 has not been precisely aligned to the ejecting position O.

The above four action stages are for completing a single cycle of the ejecting process for the die 1. It should be noted that the ejector 220 will return to the ESP from the EWP after the completion of the ejecting of the die 1, so as not to hinder the image capturing device 50 from taking images of the die 2.

After the fourth action stage, the transfer apparatus then repeats the above action stage for the next die 2 to complete the ejecting process for the die 2. In the state (c), the process is similar to that in the first action stage illustrated in the state (a) of FIG. 5, that is, the image capturing device 230 captures images and sends the image information back to the controller, so that the controller can calculate the position deviation between the die 2 and the ejecting position O and the position deviation between the dies 2 and 3 according to the received image information. In other words, during this action stage, the die 2 can be regarded as the die 1 in the previous cycle of the ejecting process, and the die 3 can be regarded as the die 2 in the previous cycle of the ejecting process.

The following stage would be similar to each of the above action stages. For example, in the state (d) of FIG. 5, the die 2 will be adjusted to align with the ejecting position O, so that the ejector 220 can perform the subsequent ejecting process.

The states (a) to (d) in FIG. 5 roughly demonstrate the image capturing stage (i.e., the first action stage) that the image capturing device 230 captures the images of the die, the center positioning stage (i.e., the second action stage) that moves the die to the ejecting position according to the image capturing result, the ejecting stage (i.e., the third action stage) that ejects the die to attach to the second substrate, and the pitch positioning stage (i.e., the fourth action stage) that moves the next die based on the pitch information obtained in the image capturing stage. In some embodiments, the above four stages may be performed sequentially and repeatedly to transfer dies from the first substrate SUB1 to the second substrate SUB2 one by one.

Compared with the transfer process performed by the traditional ejector type transfer apparatus, the difference of the present embodiment is the transfer apparatus will control the ejector 220 at the EWP to perform the ejecting process along with the first direction during the first period TP1 to transfer the objects on the first substrate SUB1 to the second substrate SUB2 (i.e., the step S140), and control the ejector 220 to move to the ESP along with the second direction which is non-parallel to the first direction (i.e., step S150), so as to expose at least one object on the first substrate SUB1 to the detection range of the image capturing device 230.

It should be noted that, in the above transfer process, although the ejector 220 is controlled to move back to the ESP for each cycle of the ejecting process as an example, so that the image capturing device 230 will recapture the images for repositioning in each cycle, the present invention is not limited thereto. In some embodiments, the transfer apparatus may also perform a series of ejecting processes by the ejector 220 and then control the ejector 220 back to the ESP to make the image capturing device 230 recaptures updated images. In other words, in the flow chart shown in FIG. 3, the steps S120 to S140 can be performed consecutively several times before moving to the step S150 and the subsequent steps.

Figure 6:
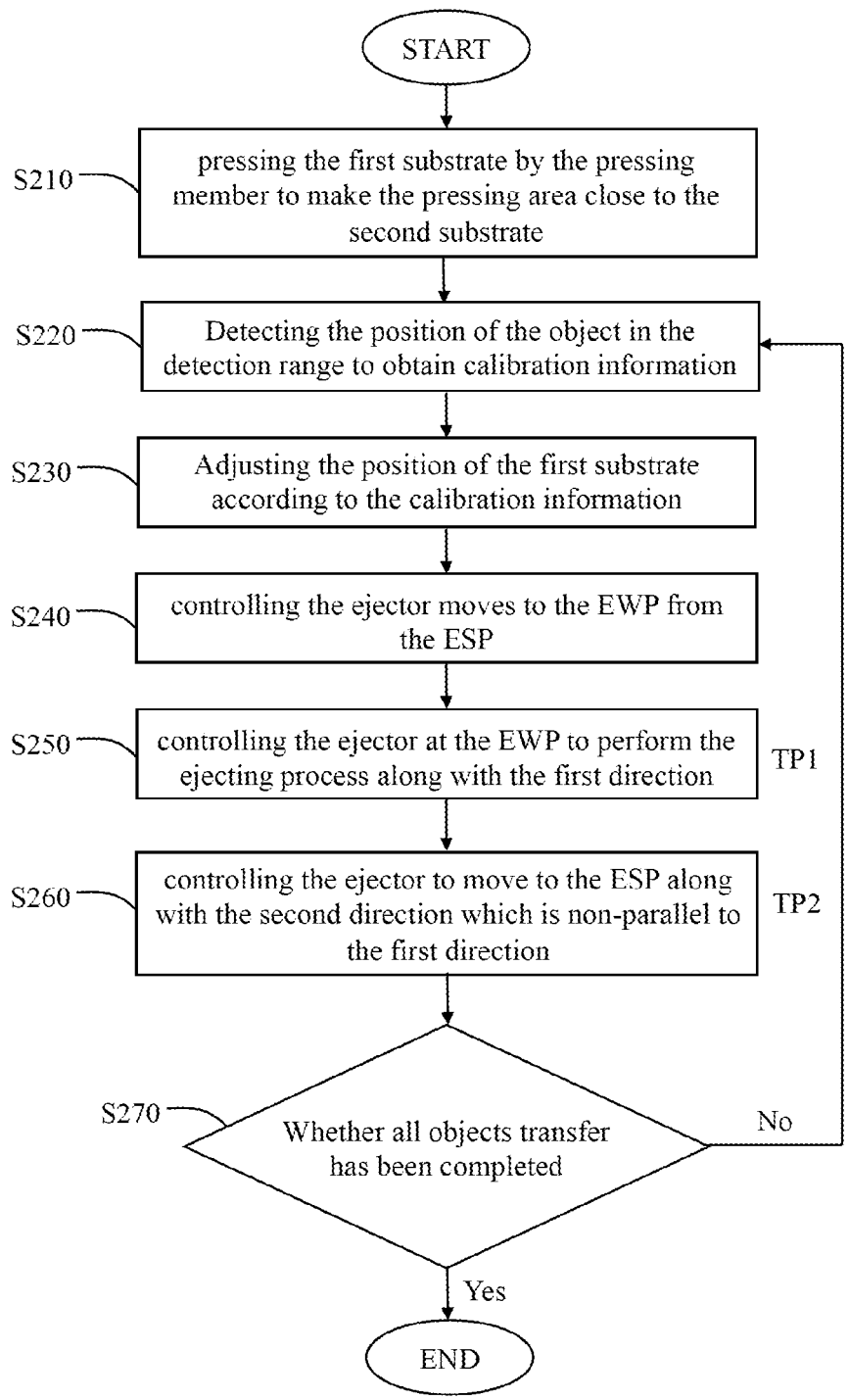
FIG. 6 is a flow chart of a method for transferring objects according to some embodiments of the present disclosure.
Figure 7A:
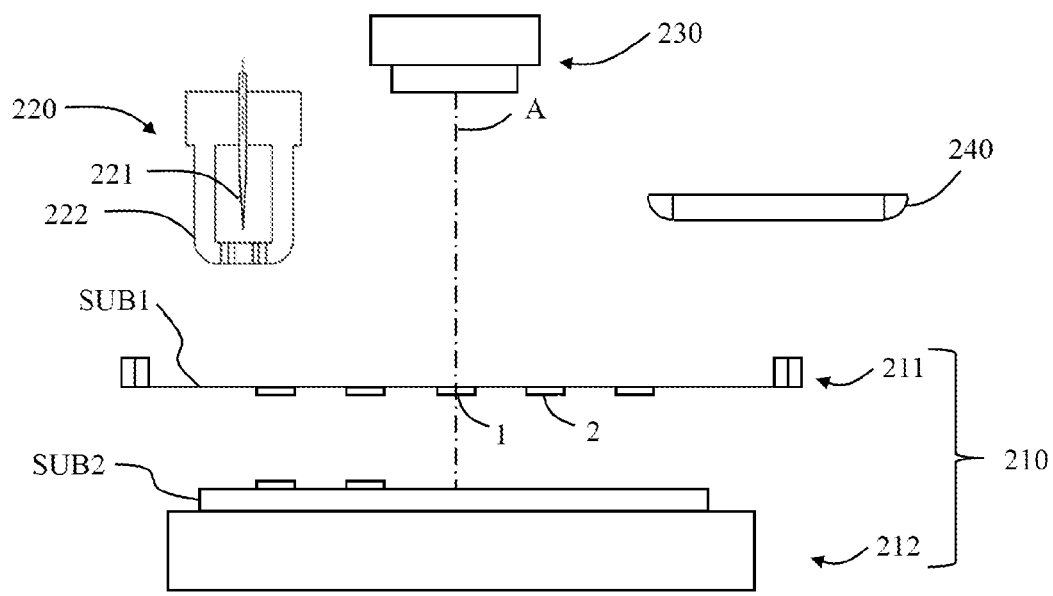
FIGS. 7A-7G are schematic diagrams of the transfer process according to some embodiments of FIG. 6.
Figure 7B:
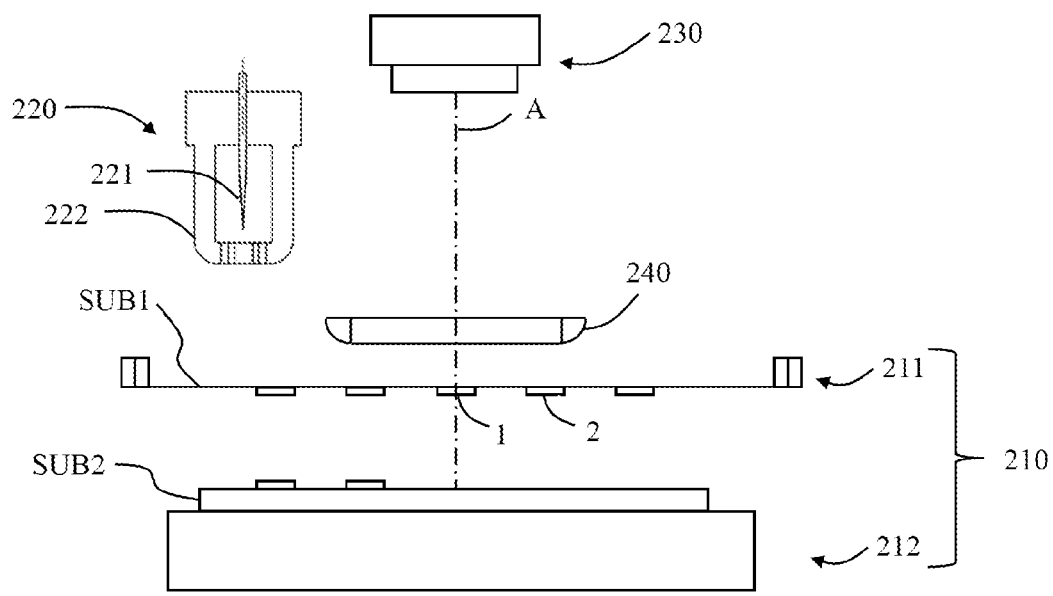
Figure 7C:
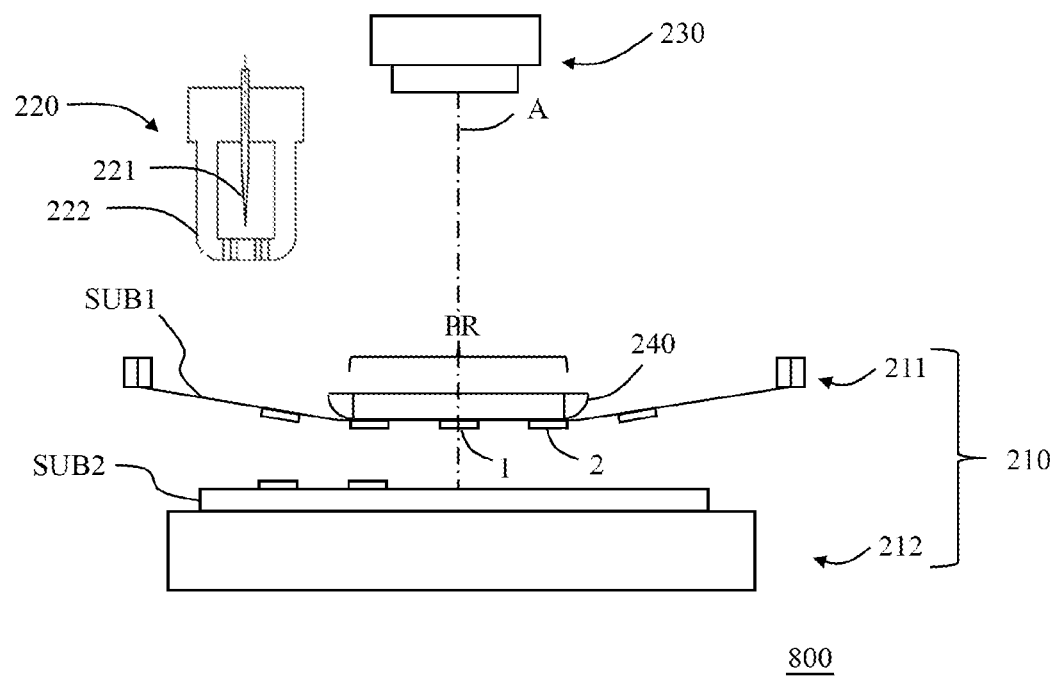
Figure 7D:
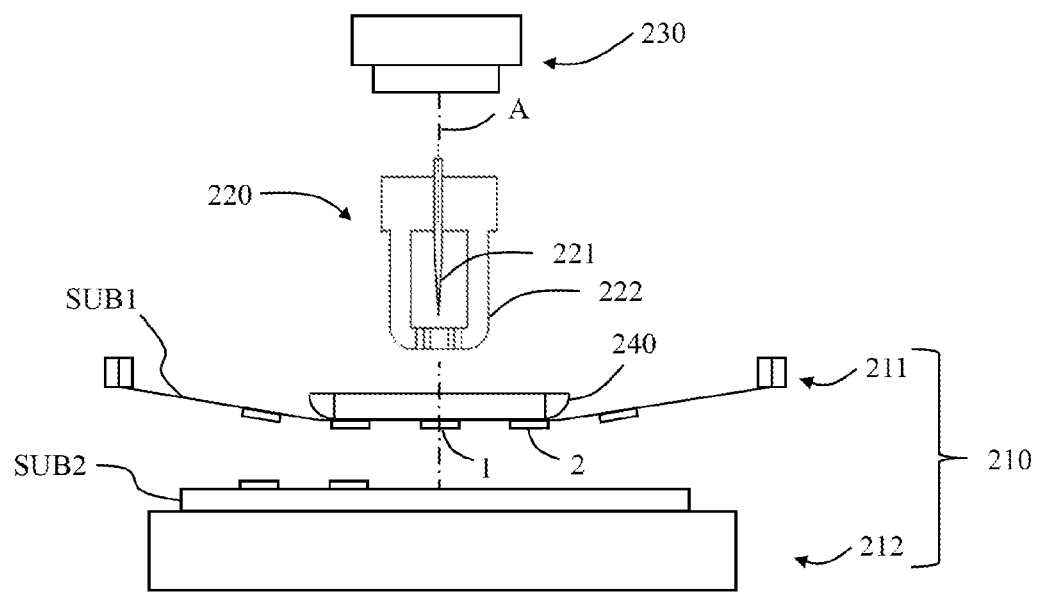
Figure 7E:
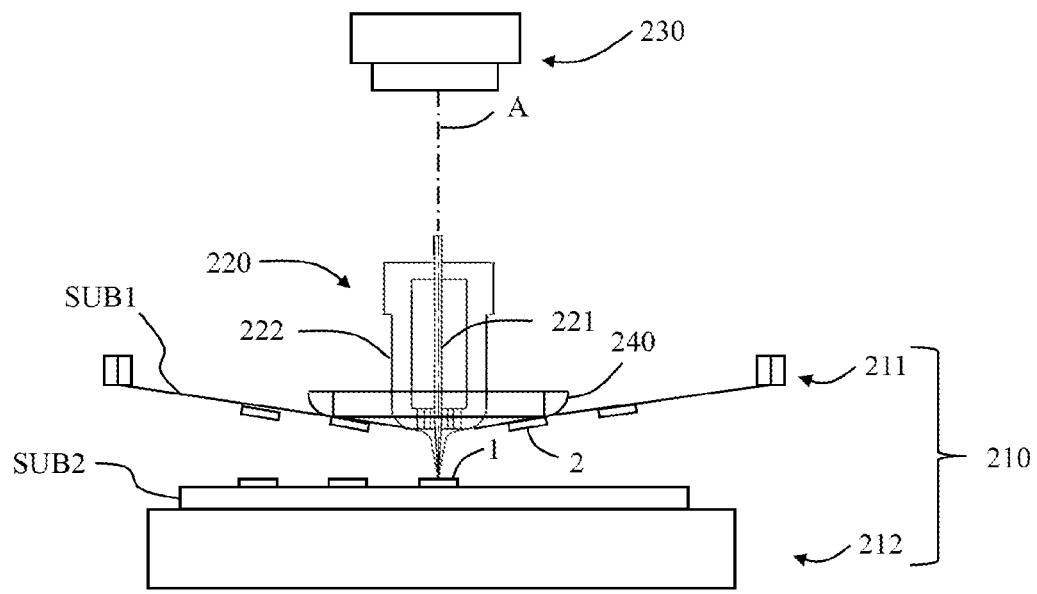
Figure 7F:
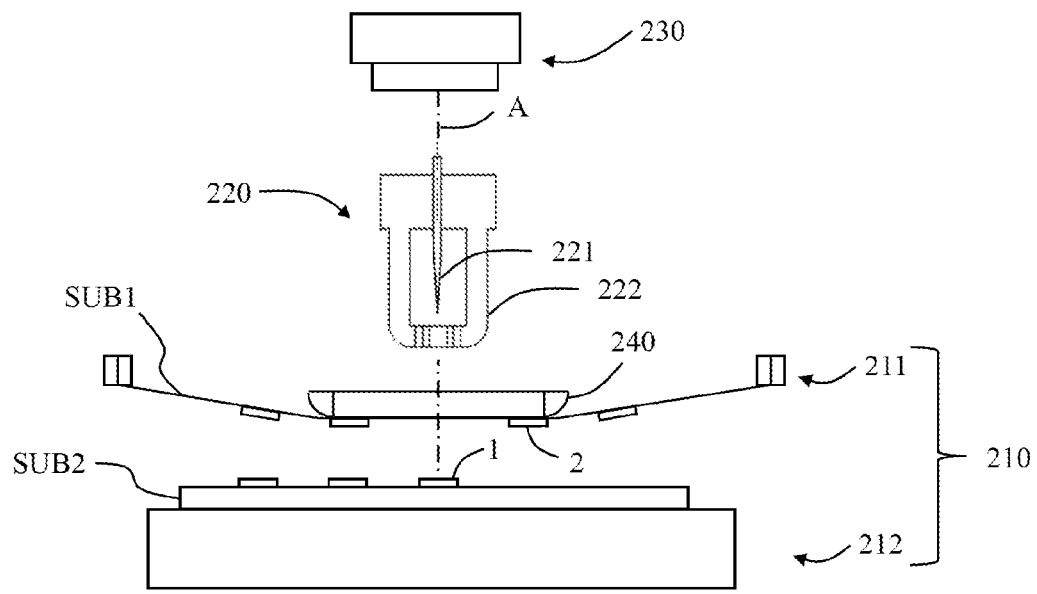
Figure 7G:
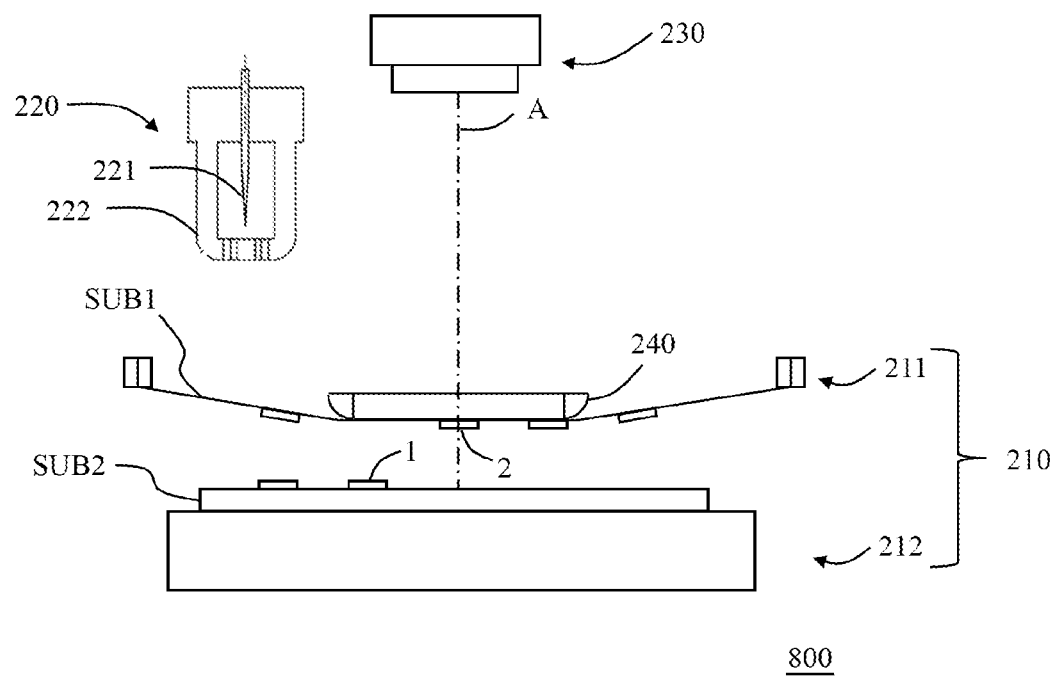

FIG. 6 to FIG. 7G are used to further illustrate the transfer process of another embodiment of the transfer apparatus disclosed in the present disclosure, where FIG. 6 is a flow chart of a method for transferring objects according to some embodiments of the present disclosure, and FIGS. 7A-7G are schematic diagrams of the transfer process according to some embodiments of FIG. 6.

In order to make the description clearer, the method of the present embodiment will be described in accordance with the transfer apparatus 800 shown in FIGS. 7A to 7I, which is similar/identical to the transfer apparatus 300 shown in FIG. 2B, so the description of each component can refer to the above embodiments, but the method of the present invention is not limited thereto.

The flow chart of the present embodiment is similar to that in FIG. 3. The detailed description of repeated parts can refer to the aforementioned embodiments and will not be repeated herein. The difference between the present embodiment and the embodiment in FIG. 3 lies in that the method in the present embodiment further includes the control process of the pressing member.

Referring to FIGS. 6 and 7A together, first, the first substrate SUB1 having the dies and the second substrate SUB2 are respectively disposed on the first platform 211 and the second platform 212, in which a side of the first substrate SUB1 contacting the dies is towards the second substrate SUB2, so that the dies are between the first substrate SUB1 and the second substrate SUB2. In the beginning, the ejector 220 is at the ESP, and the pressing member 240 is at a maintenance position.

After the first substrate SUB1 and the second substrate SUB2 have been correctly set up, as shown in FIG. 7B, the pressing member 240 will be moved from the maintenance position to the ESP. In this case, the image capturing device 230 will be coaxial with the pressing member 240. Then, as shown in FIG. 7C, the pressing member 240 will be controlled to move downwards to press the first substrate SUB1, so that the pressed area PR on the first substrate SUB1 comes close to the second substrate SUB2 (step S210), wherein the pressed area PR is the tension-holding area (hereinafter "tension-holding area PR"). After the tension-holding area PR is established, the image capturing device 230 will detect the position of the object CP within its detection range to obtain the calibration information (step S220).

After the calibration information has been calculated, the controller will adjust the position of the first platform 211 according to the calibration information to align the die 1 to be ejected with the transferring area on the second substrate SUB2 (step S230). The calibration steps are described in the embodiment of FIG. 5 and will not be repeated herein.

The ejector 220, originally located in the ESP, is controlled to move from the ESP to the EWP when receiving the indication to start the ejecting process, as shown in FIG. 7D (Step S240).

Then, as shown in FIG. 7E, the ejector 220 at the EWP is controlled to perform the ejecting process along with the first direction (step S250). In the present embodiment, the pressing member 240 is taken as an example in a circular design. The ejecting member 221 and the ejecting cap 222 will move downwards simultaneously for a distance and pass through the opening of the pressing member 240, and then the ejecting cap 222 stops moving and the ejecting member 221 continues to move downwards, so that the moving ejecting member 221 protrudes outward the ejecting cap 222 to push the die 1 moving towards the second substrate SUB2 until the die 1 attaches to the second substrate SUB2. The ejecting member 221 will then move back and retract inside the ejecting cap 222, and both the ejecting member 221 and the ejecting cap 222 move upwards to return to the EWP, as shown in FIG. 7F.

After the step S250, as shown in FIG. 7G, the ejector 220 is controlled to move from the EWP to the ESP along with a second direction that is not parallel to the first direction (step S260). On the other hand, the first platform 211 and the second platform 212 will shift the first substrate SUB1 and the second substrate SUB2 respectively according to the calibration information, so that the next die 2 to be ejected will move to the axis A to align with the next transferring area on the second substrate SUB2, and thus the transfer process for the die 1 is completed. In the present embodiment, when the first platform 211 is position calibrated or adjusted, the pressing members of 240 will be maintained at the pressing position, which can keep the tension-holding area PR existing in the transfer process, and only the dies within the area would be changed along with the position calibration of the first substrate SUB1, but the present invention is not limited thereto. In other embodiments, the pressing member 240 can return to the pressing standby position from the pressing working position after one or a plurality of cycles of the ejecting process is complete.

The controller then determines whether all die transfer has been completed (step S270). If it is determined to be no, the process will go back to step S220 to eject the next die. If yes, the transfer process ends.

Figure 8A:
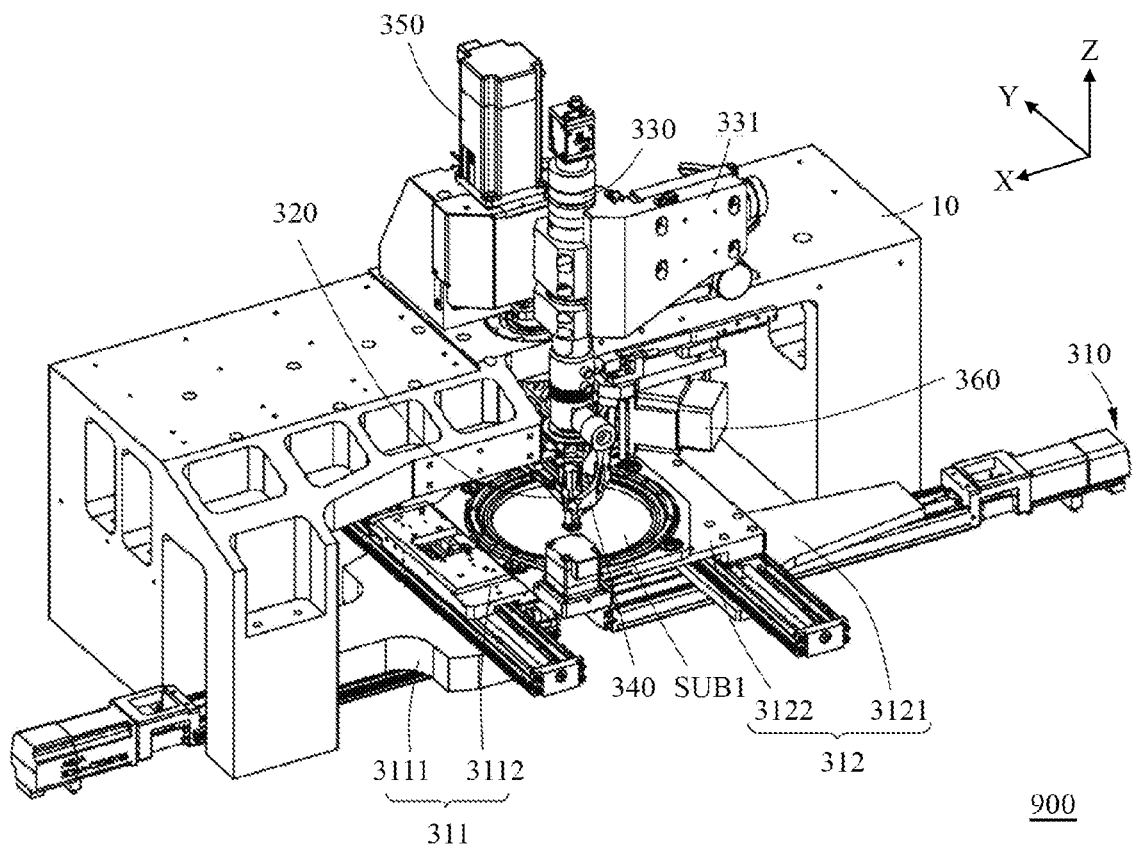
FIGS. 8A and 8B are schematic stereo structure diagrams of a transfer apparatus according to some embodiments of the present disclosure.
Figure 8B:
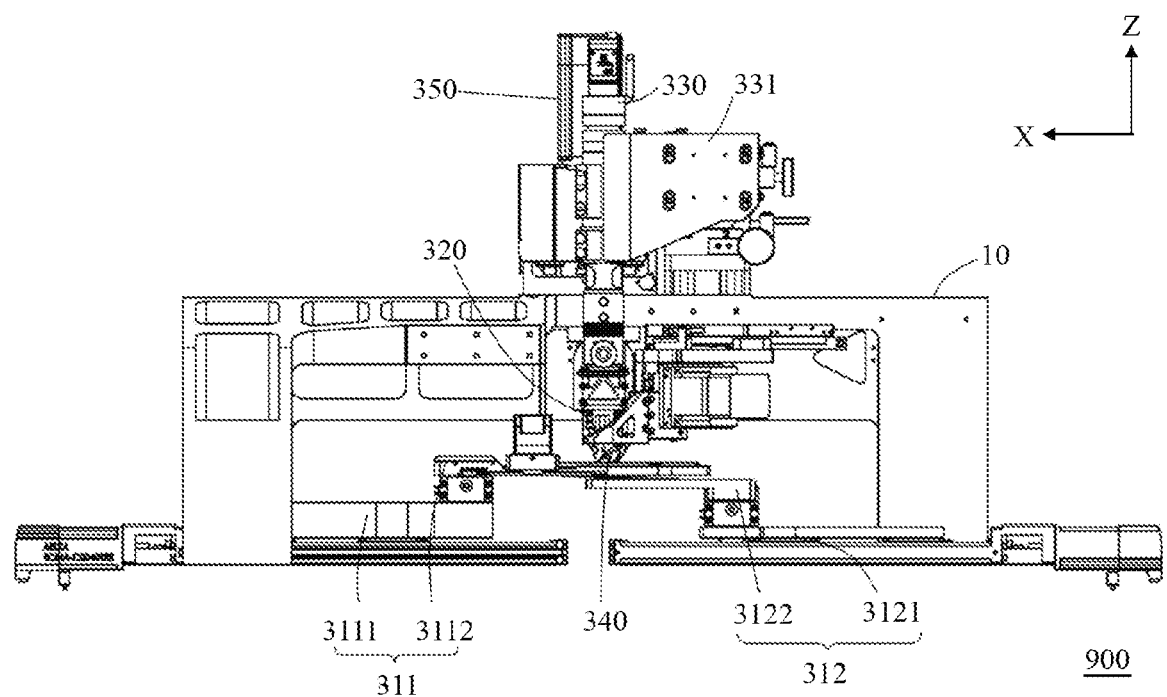
Figure 9A:
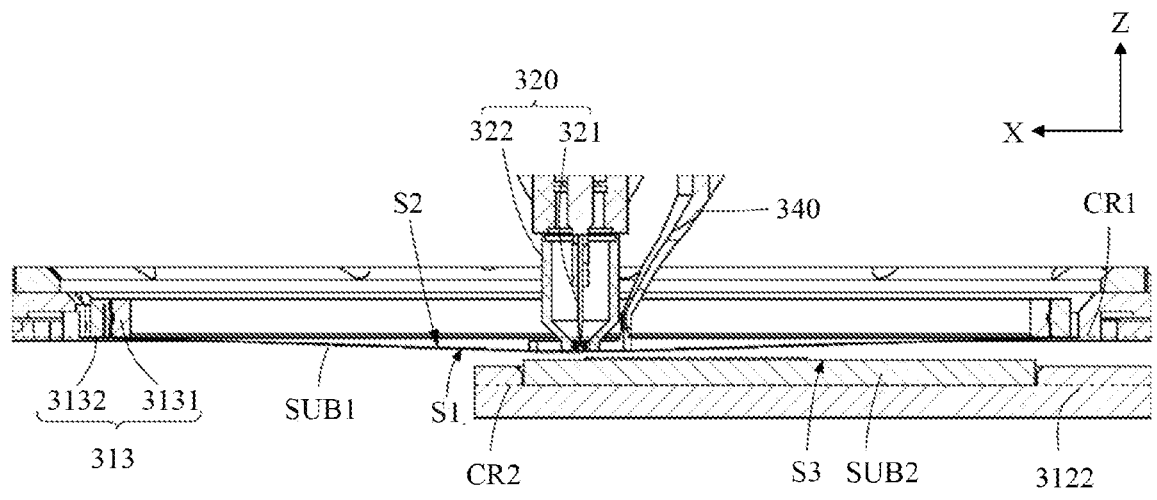
FIGS. 9A and 9B are partial zoom-in diagrams of a transfer apparatus according to some embodiments of the present disclosure.
Figure 9B:
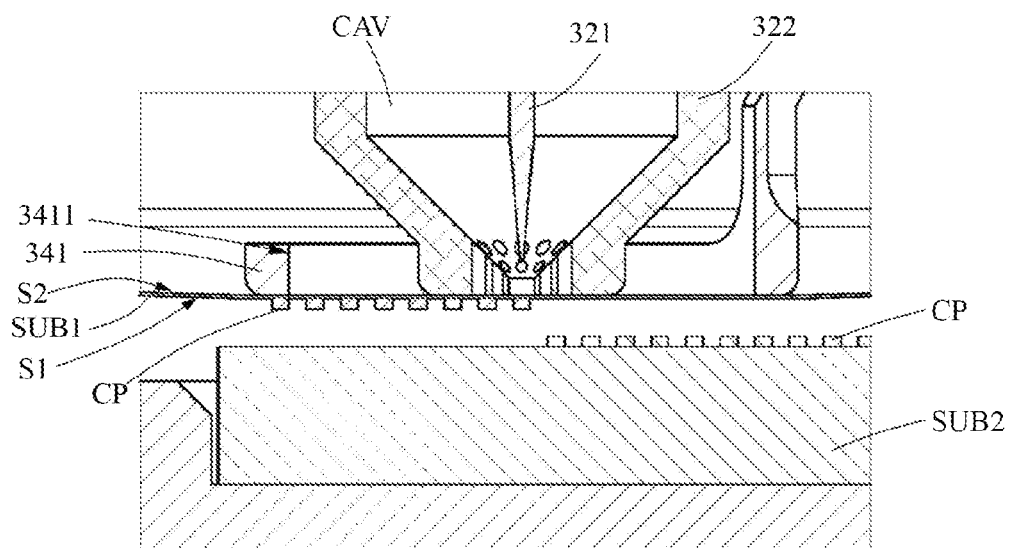

The exemplary embodiment of the transfer apparatus of the present disclosure is further illustrated in FIGS. 8A to 9B below, where FIGS. 8A and 8B are schematic stereo structure diagrams of a transfer apparatus according to some embodiments of the present disclosure, and FIGS. 9A and 9B are partial zoom-in diagrams of a transfer apparatus according to some embodiments of the present disclosure.

Referring to FIGS. 8A-8B and 9A-9B together, the transfer apparatus 900 of the present embodiment includes a base 10, a movable placement device 310, an ejector 320, an image capturing device 330, and a pressing member 340, wherein the movable placement device 310, the ejector 320, the image capturing device 330, and the pressing member 340 are disposed on the base 10.

In the movable placement device 310 of the present embodiment, the first platform 311 has a first bearing area CR1 configured to carry the first substrate SUB1, and the second platform 312 has a second bearing area CR2 configured to carry the second substrate SUB2. In the present embodiment, the first bearing area CR1 refers to the area consistent with the plane area of the first substrate SUB1 when the first substrate SUB1 is placed on the first platform 311. The second bearing area CR2 refers to the area consistent with the plane area of the second substrate SUB2 when the second substrate SUB2 is placed on the second platform 312. In other words, the first bearing area CR1 and the second bearing area CR2 are respectively defined as virtual plane areas, which are used to indicate the position of the first substrate SUB1 and the second substrate SUB2 when placed on the movable placement device 310. Therefore, it is understood that when the movable placement device 310 changes the position of the first substrate SUB1 and/or the second substrate SUB2, the position of the first bearing area CR1 and the second bearing area CR2 will also change accordingly.

In the present embodiment, the surface of the first substrate SUB1 facing the second substrate SUB2 is configured to place at least one object CP. Specifically, the first substrate SUB1 has a bearing surface S1 for bearing the object CP and a contact surface S2 behind the bearing surface S1, and the bearing surface S1 faces toward the second substrate SUB2. The second substrate SUB2 has a mounting surface S3 for mounting the object CP, and the mounting surface S3 faces toward the first substrate SUB1.

The movable placement device 310 in the present embodiment further includes an expansion ring 313, wherein the first substrate SUB1 is fixed by the expansion ring 313. The expansion ring 313 includes an inner ring 3131 and an outer ring 3132, and the circumference of the first substrate SUB1 is fixed by the inner ring 3131 and the outer ring 3132.

Further, the first platform 311 is disposed on one side of the base 10. The first platform 311 includes a first pedestal 3111 and a bearing plate 3112. The first pedestal 3111 is movable on the X-axis relative to the base 10, and the bearing plate 3112 is disposed on the first pedestal 3111 and is movable on the Y-axis. Therefore, the object CP on the expansion ring 313 can move back and forth on the X-Y plane, making it easy to be placed, picked up, and shifted.

The second platform 312 is disposed on the other side of the base 10. The second platform 312 includes a second pedestal 3121 and a clamping member 3122. The second pedestal 3121 is movable on the X-axis relative to the base 10, the clamping member 3122 is configured to clamp the second substrate SUB2, and the clamping member 3122 is disposed on the second pedestal 3121 and is movable on the Y-axis. Therefore, the second substrate SUB2 can move back and forth in the X-Y plane, making it easy to be placed, picked up, and shifted.

The ejector 320 is movably disposed on the side of the first bearing area CR1 away from the second substrate SUB2. In the present embodiment, the ejector 320 can be moved in horizontal and/or vertical planes. Its specific operating mechanism can be referred to the above embodiments and will not be repeated herein.

To be specific, the ejector 320 includes an ejecting member 321 and an ejecting cap 322. The ejecting member 321 can protrude outwards the cavity CAV of the ejecting cap 322 to eject the object CP, thus transferring the object CP from the first substrate SUB1 to the second substrate SUB2. In the present embodiment, the ejecting member 321 can be a needle. The needle can be set for a single needle or multiple needles, and the present invention is not limited thereto.

When the ejector 321 ejects the object CP, the cavity CAV of the ejecting cap 322 becomes a vacuum state, so that the bottom of the ejecting cap 322 adsorbs the first substrate SUB1, making the bottom of the ejecting cap 322 contacts the contact surface S2 of the first substrate SUB1. Then the ejecting member 321 protrudes outwards from the ejecting cap 322 and ejects the object CP to transfer the object CP from the first substrate SUB1 to the second substrate SUB2. After that, the ejecting member 321 returns to the ejecting cap 322. It can be understood that, by disposing the ejecting member 321 capable of protruding outwards from the ejecting cap 322, the bottom of the ejecting cap 322 can contact, while the ejecting member 321 ejects the object CP, the contact surface S2 of the first substrate SUB1 to prevent the first substrate SUB1 from sticking to the front end of the ejecting member 321 and causing the offset of the first substrate SUB1. Therefore, the ejecting efficiency can be effectively improved.

The image capturing device 330 is fixedly disposed on the base 10 by a fixation component 331 and is located on the side of the first bearing area CR1 away from the second bearing area CR2 to capture the image of the object CP to be ejected. For the fixation component 331, any well-known structures can be applied and will not be described herein.

The pressing member 340 is movably disposed on the side of the first bearing area CR1 away from the second bearing area CR2 to press the first substrate SUB1 so that the mounting area of the object CP on the first substrate SUB1 comes close to the second substrate SUB2. The press member 340 of the present embodiment includes a pressing ring 341 that allows the bottom of the ejecting cap 322 of the ejector 320 to pass through. The ejecting cap 322 passes through the pressing ring 341 via a notch (or opening) 3411 defined by the pressing ring 341 and therefore does not interfere with the ejecting member 321 ejecting the object CP.

More specifically, the diameter of the notch 3411 is greater than or equal to 6 mm. In some embodiments, the notch 3411 has a diameter of 16 mm. In addition, in an exemplary embodiment, the inner diameter D1 of the pressing ring 341 is 13.5 mm and the outer diameter D2 is 16.0 mm. In some embodiments, the inner diameter ranges from approximately 8 mm to 20 mm, and the ring width D3 of the pressing ring 341 ranges from approximately 1 to 2 mm. It is understood that the diameter of the notch 3411 is not specifically restricted, provided that at least part of the ejector 320 is allowed to pass through. In the present embodiment, the notch 3411 allows the bottom of the ejecting cap 322 of the ejector 320 to pass through without hindering the ejecting member 321 from ejecting against the object CP. The specific structural configuration of the ejector 320 will be further explained in the following embodiments.

Specifically, before ejecting the object CP, the pressing member 340 is at the pressing standby position. The pressing member 340 moves from the pressing standby position to the pressing working position until all the objects CP on the first substrate SUB1 are transferred to the second substrate SUB2. The pressing member 340 returns the pressing standby position from the press working position.

In the present embodiment, the transfer apparatus 100 further includes a first driving device 350 and the second driving device 360, wherein the first driving device 350 is configured to drive the ejector 320 to move along with a specific trajectory, and the second driving device 360 is configured to drive the pressing member 340 to move in the vertical plane. To be more specific, the second driving device 360 can be used to drive the pressing member 340 to move in the Z direction (which is the preset moving direction).

Further, the pressing member 340 can also move on horizontal and vertical planes under the control of the second driving device 360. It can be understood that the pressing member 340 can be moved on the horizontal plane for repair or replacement. In other words, in addition to moving along with the vertical plane (i.e., the plane including the Z-axis), the pressing member 340 can be further configured to move on the horizontal plane (i.e., X-Y plane), such as moving from the maintenance position to the pressing standby position, or returning to the maintenance position from the pressing standby position, so as to facilitate personnel to repair or replace the pressing member 340.

In the present embodiment, after the expansion ring 313 is installed onto the bearing plate 3112, the pressing member 340 moves to the first substrate SUB1 and presses the first substrate SUB1 under the control of the second driving device 360 during the ejecting process, so that the mounting area of the objects CP on the first substrate SUB1 comes close to the second substrate SUB2. The pressing member 340 keeps pressing on the first substrate SUB1 until the objects CP on the first substrate SUB1 are transferred to the second substrate SUB2. After that, the pressing member 340 will be moved to the pressing standby position under the control of the second driving device 360 and wait for the replacement of the next substrate then repeat the above steps.

The expansion ring 313 is usually installed manually and fixed by a secure structure. In addition, the inner ring 3131 and the outer ring 3132 of the expansion ring 313 may also have tolerances when combined, and it would be more costly to achieve height control by fine-tuning the distance between the first substrate SUB1 and the second substrate SUB2 through the expansion ring 313.

This is because in addition to the large area of the entire expansion ring 313 which makes the larger position deviation, it is also difficult to ensure the expansion ring 313 to be placed at the same position each time due to the manual installation, so that the height of the first substrate SUB1 is also difficult to be adjusted to the same level. As a result, it is difficult to ensure the distance between the first substrate SUB1 and the second substrate SUB2 is uniform. In contrast, according to the present embodiment, since the first substrate SUB1 will be pressed by the pressing member 340 which has the pressing working position to be fixed, even if there is a difference in the placement position of the expansion ring 313 in each stage, the distance between the mounting area of the object CP to be ejected on the substrate SUB1 and the second substrate SUB2 can be kept consistent, and therefore the height control can be easily achieved.

Additionally, by selecting the diameter of the notch of the pressing ring 341 to allow the bottom of the ejecting cap 322 to pass through, the friction between the first substrate SUB1 and the pressing ring 341 generated from the expansion ring 313 moves horizontally can be reduced and the tension in the area in the first substrate SUB1 in contact with the pressing member 340 is more stable. Of course, the diameter of the pressing ring 341 can be adjusted correspondingly according to requirements, which is not limited thereto. The specific configuration of the pressing member 340 will be further described in the following embodiments.

On the other hand, because the object CP could be a die with small size, for example, a cuboid with the length about 0.08-0.15 mm, the dies may easily overturn or skew in the ejecting process if the offset of the ejecting member 321 is greater than 0.01 mm. In order to ensure the ejecting member 321 of the ejector 320 can apply the force precisely on the center of each object CP to guarantee the positional accuracy, the object CP to be ejected, the ejector 320, the image capturing device 330, and the pressing member 340 can be coaxial. The position of the objects can be accurately calculated based on the information captured by the image capturing device 330, so that the object CP to be ejected can be moved to the center of the ejector 320 to achieve the coaxial configuration.

Figure 10:
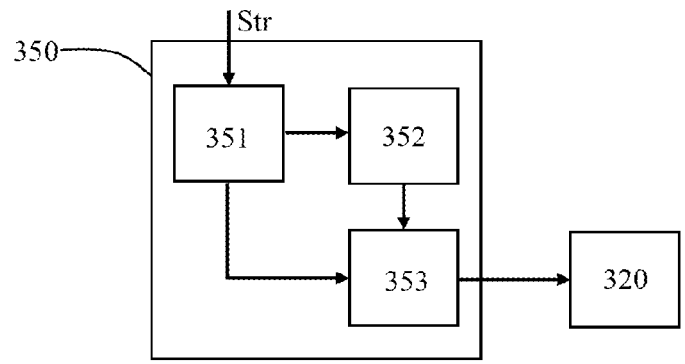
FIG. 10 is a schematic functional block diagram of a first driving device according to some embodiments of the present disclosure.

FIG. 10 is a schematic functional block diagram of a first driving device according to some embodiments of the present disclosure. Referring to FIG. 10, the first driving device 350 of the present embodiment includes a screw assembly 351, an axial movement member 352, and a driving assembly 353. The screw assembly 351 is configured to rotate in control of the transfer control signal Str of the controller. The axial movement member 352 is coupled to the screw assembly 351 and configured to move along with the first axial in response to the rotation of the screw assembly 351. The first axial direction can be determined by the designed ejecting direction of the ejector 320. The driving assembly 353 is coupled to the screw assembly 351, the axial movement member 352, and the ejector 320. The driving assembly 353 is configured to drive the ejector 320 generating an angular displacement relative to the first axial direction in response to the rotation of the screw assembly 351, and generating an axial displacement relative to the first axial direction in response to the displacement of the axial movement member 352. In the present embodiment, the first driving device 350 can realize the multi-axis drive of the ejector 320 by a single parameter input (i.e., control the input rotation of the screw assembly 351), thus effectively simplifying the design.

Figure 11:
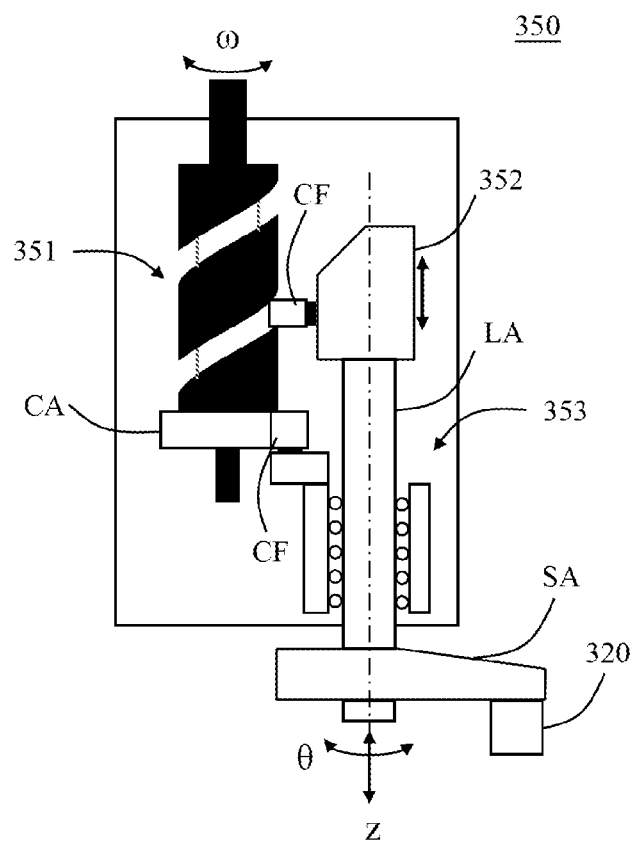
FIG. 11 is a schematic diagram of the first driving device according to some embodiments of the present disclosure.

In detail, the first driving device 350 can be implemented by the configuration in FIG. 11, which is a schematic diagram of the first driving device according to some embodiments of the present disclosure. Referring to FIG. 11, the upper end of the screw assembly 351 can rotate in response to a torque applied to it. The torque can be realized by a gear system or other mechanism, the present invention is not limited thereto. The speed parameter, generated by the rotating torque applied to the screw assembly 351, can be defined as the input rotation w.

In the present embodiment, the driving assembly 353 includes, for example, a swinging arm structure and a rotating transmission structure. The swinging arm structure includes a long arm LA and a short arm SA, wherein one end of the long arm LA is coupled to the axial movement member 352, the other end of the long arm LA is fixed with one end of the short arm SA, and the other end of the short arm SA is coupled to the ejector 320. The rotating transmission structure is disposed around the long arm LA to apply the rotating torque to the long arm LA in response to the rotation of the screw assembly 351. In the present embodiment, the rotating transmission structure may be, for example, a bolt groove shaft or a cross roller direct moving track, but the present invention is not limited thereto.

When the screw mechanism 351 rotates, the rotation force will be transmitted to the axial movement member 352 and the rotating transmission structure of the driving assembly 353 through a cam CA and a cam follower CF, in which the axial movement member 352 will move along with the Z-axis in response to the drive of the cam follower CF. The rotating transmission structure will apply the rotating torque to the long arm LA in response to the drive of the cam follower CF.

Figure 12:
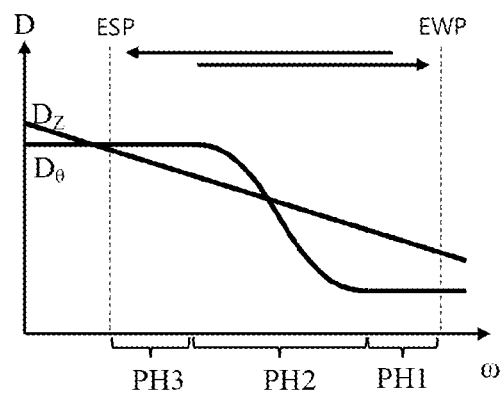
FIG. 12 is a schematic diagram of the displacement of the ejector according to some embodiments of the present disclosure.

Therefore, when the screw assembly 351 rotates, the axial movement member 352 drives the long arm LA to move along with the Z-axis synchronously while the axial movement member 352 moves along with the Z-axis, so that a Z-axis displacement DZ is generated in the ejector 320. In the meanwhile, the long arm LA drives the short arm SA and the ejector 320 in response to the rotating torque applied to it to generate an angular displacement DO with the long arm LA as the axis. Thus, the ejector 320 may realize the multi-axis movement. The corresponding relationship between Z-axis displacement DZ and the angular displacement DO of the ejector 320 under different input rotation w is shown in FIG. 12.

In the present embodiment, it can be noted that the ejector 320 has several different phases PH1 to PH3 as it moves back and forth between the ESP and the EWP. In terms of the trip of the ejector 320 from the EWP back to the ESP, it will first go through the phase PH1 that the ejector 320 has the displacement DZ, which only moves along with the Z-axis upward away from the first substrate SUB1, but not the angular displacement DO. In other words, during the phase PH1, the ejector 320 moves only in the vertical direction and does not rotate.

Then, when the thruster 320 moves up a certain distance, it enters the stage PH2 where the angular displacement DO begins to occur. At this point, the ejector 320 will move upward with a rotating motion, so the movement trajectory will be curved. After that, when the ejector 320 is close to the ESP, it enters the stage PH3, and the angular displacement DO returns to zero again, and only the z-axis displacement DZ is left for the ejector 320. Through the above three stages PH1 to PH3, the multi-axial movement control of the first drive device 350 and the ejector 320 can be realized.

Figure 13:
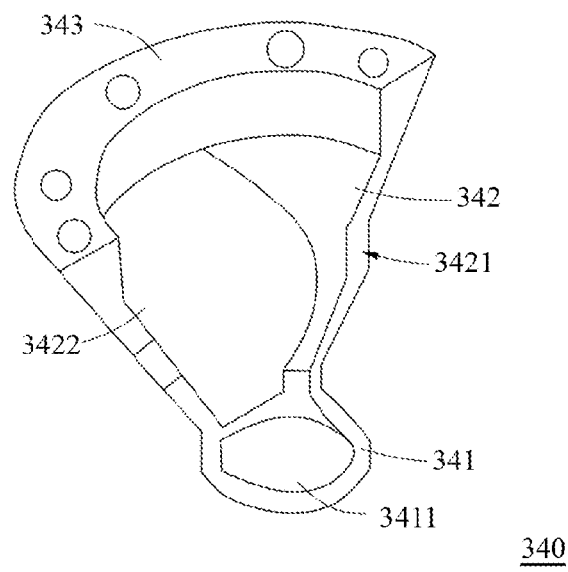
FIG. 13 is a schematic stereo structure diagram of a pressing member according to some embodiments of the present disclosure.
Figure 14A:
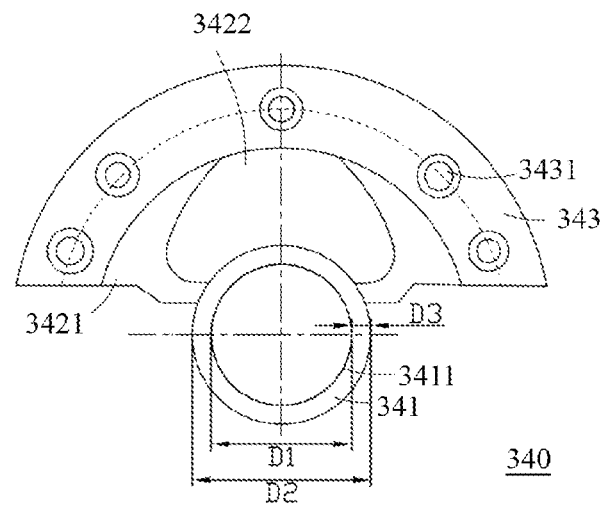
FIGS. 14A-14C are schematic diagrams from different views of the pressing member according to some embodiments of FIG. 13.
Figure 14B:
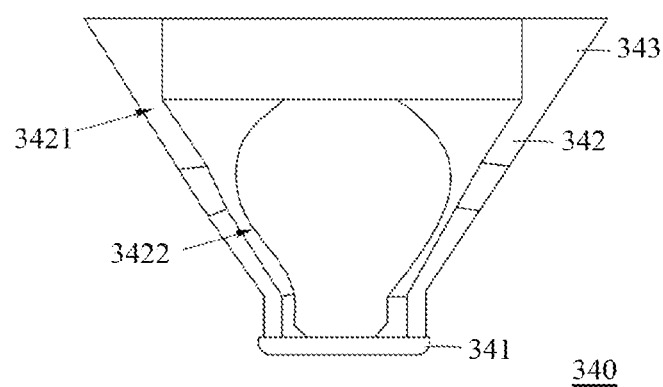
Figure 14C:
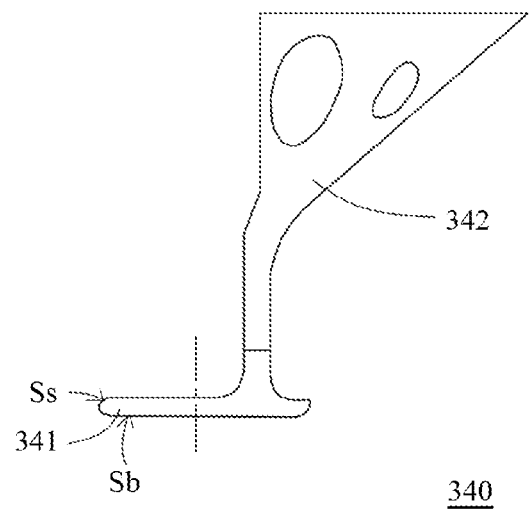

The specific exemplary structure of the pressing member is further illustrated in FIGS. 13 to 14C below, where FIG. 13 is a schematic stereo structure diagram of a pressing member according to some embodiments of the present disclosure, and FIGS. 14A-14C are schematic diagrams from different views of the pressing member according to some embodiments of FIG. 13.

Referring to FIG. 13 to FIG. 14C, the pressing member 340 of the present embodiment includes a pressing ring 341, a side wall 342, and mounting member 343.

In the present embodiment, the junction between the bottom surface Sb and the side surface Ss of the pressing ring 341 forms a fillet angle (also known as R angle), and the arc angle of the R angle is, for example, 0.5 mm to prevent the bottom surface Sb of the pressing ring 341 from scratching the first substrate SUB1 when the first substrate SUB1 moves horizontally. In other embodiments, the junction between the bottom surface Sb and the side surface Ss of the pressing ring 341 can also be formed by other shapes, such as an obtuse angle, as long as the first substrate SUB1 can bear the scratching without being damaged.

In the present embodiment, the side wall 342, which is a hollow structure, is formed on the pressing ring 341. To be specific, a notch 3421 is formed on the side wall 342 away from the first bearing area CR1 for the ejector 320 to pass through. Specifically, the ejector 320 passes through the notch 3421 to move back and forth either from the ESP to the EWP or from the EWP to the ESP.

It can be understood that the size of the notch 3421 is not limited, so long as it does not prevent the ejector 320 from passing through the notch 3421 to and from the ESP and the EWP. In the present embodiment, the notch 3421 runs through both sides of the side wall 342, that is, the first notch 3421 extends from a side of the side wall 342 away from the pressing ring 341 to the pressing ring 341.

In the present embodiment, the preset moving direction is the longitudinal direction (or the length direction of the ejecting member 341), of course, in other embodiments, it can be adjusted according to requirements, and the present invention is not limited thereto.

Further, the perforation 3422 is formed on the side wall 342. The perforation 3422 is arranged opposite the first notch 3421.

In the present embodiment, the mounting member 343 is substantially in a C-shape, and the mounting member 343 is arranged opposite to the pressing ring 341, respectively on both sides of the side wall 342.

Further, the mounting member 343 is provided with a plurality of mounting holes 3431 for mounting to base 10 by a secure mechanism (not shown). In the present embodiment, the thickness of mounting member 343 increases with the distance away from the side wall 342, so that the mounting holes 3431 can be easily formed on the mounting member 343.

It can be understood that by setting the mounting part 343 as a C-shape, one side of the pressing member 340 is provided with the side wall 342, while the other side is not provided with the notch 3421, which is configured to allow the ejector 320 to pass through and move to the EWP, that is, the position directly above the object CP. In addition, the notch 3421 is arranged opposite the perforation 3422 in the side wall 342, so that light sources on both sides (not shown) can pass through the notch 3421 and the perforation 3422 respectively, thus facilitating lighting during the image capturing.

In other embodiments, the pressing member 340 can also use other structures, as long as it can press to the first substrate SUB1 so that the mounting area of the object CP to be ejected on the first substrate SUB1 comes close to the second substrate SUB2. The specific structure of the pressing member 340 is not limited to those described in the embodiments of the present disclosure.

Specific exemplary embodiments are used to explain the principle and implementation of the present application in the disclosure. However, the above embodiments are intended merely to assist in understanding the present application. It can be understood that those having ordinary skills in the art may easily contemplate various changes and modifications of the technical solution and technical ideas of the present application. In summary, the contents in the specification should not be considered as a limitation of the present application.

What is claimed is:

1. A method for transferring objects, adapted for transferring at least one object on a first substrate to a second substrate by an ejector, comprising:
controlling, during a first period, the ejector at an ejecting working position to perform an ejecting process along with a first direction, to apply a first acting force to the first substrate toward the second substrate, thereby transferring the object from the first substrate to the second substrate;
controlling, during a second period, the ejector to move to an ejecting standby position along with a second direction, which is non-parallel to the first direction, to expose the object on the first substrate to a detection range of an image capturing device, wherein a relative displacement between the ejector and the image capturing device is generated during the second period;
detecting the position of the object in the detection range by the image capturing device to obtain calibration information; and
adjusting the position of the first substrate according to the calibration information.

2. The method for transferring objects according to claim 1, further comprising:
after obtaining the calibration information, controlling the ejector to move to the ejecting working position from the ejecting standby position and entering the first period.

3. The method for transferring objects according to claim 1, wherein the first direction is substantially orthogonal to the plane of the first substrate.

4. The method for transferring objects according to claim 3, wherein the first direction is substantially overlapped with an image capturing axis of the image capturing device when the ejector is at the ejecting working position and performs the ejecting process.

5. The method for transferring objects according to claim 1, wherein the ejector has a linear motion path when moving to the ejecting standby position along with the second direction.

6. The method for transferring objects according to claim 1, wherein the ejector has a nonlinear motion path when moving to the ejecting standby position along with the second direction.

7. The method for transferring objects according to claim 6, wherein the nonlinear motion path comprises an angular displacement component and a linear displacement component.

8. The method for transferring objects according to claim 1, further comprising:
pressing the first substrate towards the second substrate to establish a tension-holding area on the first substrate, wherein the object to be ejected is located in the tension-holding area.

9. The method for transferring objects according to claim 8, wherein the shortest distance between the tension-holding area and the second substrate is less than the shortest distance between the area of the first substrate other than the tension-holding area and the second substrate.

10. The method for transferring objects according to claim 1, further comprising:

pre-scanning a third substrate during the periods that the object being transferred from the first substrate to the second substrate; and repeating the steps in claim 1 to transfer the object from the first substrate to the third substrate after the transferring of the second substrate is complete.

11. The method for transferring objects according to claim 10, wherein the step of pre-scanning the objects on the third substrate comprises:

capturing image information for the third substrate to define transferring area; and locating the third substrate based on the defined transferring area before entering the first period.

12. A transfer apparatus, adapted for transferring at least one object on a first substrate to a second substrate, comprising:

a movable placement device, configured to carry the first substrate and the second substrate on a first bearing area and a second bearing area, respectively, so that the first substrate and the second substrate are oppositely disposed from each other with a gap and capable of moving relatively;

a pressing member, movably disposed on a side of the first bearing area away from the second bearing area and configured to press the first substrate along with a preset moving direction, so that a mounting area of the object to be ejected on the first substrate comes close to the second substrate, wherein the preset moving direction is the direction of the first bearing area towards the second bearing area; and an ejector, movably disposed on the side of the first bearing area away from the second bearing area and comprising an ejecting member configured to eject, by its front-end, the object along with the preset moving direction and passing through the pressing member, wherein the pressing member comprises:

a pressing portion, configured to contact with and apply a pressing force to the first substrate to form the mounting area; and a sidewall, formed at least partially wrapped around the pressing portion and having a first notch at the side away from the first bearing area, and the first notch is configured to allow the ejector to pass through while moving.

13. The transfer apparatus according to claim 12, further comprising:

a screw assembly, configured to rotate in control of a controller;

an axial movement member, coupled to the screw assembly and configured to move along with a first axial direction in response to the rotation of the screw assembly; and a driving assembly, coupled to the screw assembly, the axial movement member, and the ejector, and configured to drive the ejector generating an angular displacement relative to the first axial direction in response to the rotation of the screw assembly and generating an axial displacement relative to the first axial direction in response to the displacement of the axial movement member.

14. The transfer apparatus according to claim 12, wherein a second notch is formed on a side of the pressing portion close to the first bearing area.

15. The transfer apparatus according to claim 14, wherein the pressing portion further includes a pressing ring and a mounting member; the pressing ring defines the shape of the second notch; and the mounting member and the pressing ring are oppositely disposed from each other, at both sides of the sidewall respectively.

16. The transfer apparatus according to claim 12, further comprising:

an image capturing device fixedly disposed on a side of the first bearing area away from the second substrate, and the image capturing device is configured to take an image of the object to be ejected.

17. The transfer apparatus according to claim 12, wherein the relative position of the ejector, the pressing member, and the image capturing device are coaxial when the ejector ejects the object.

18. The transfer apparatus according to claim 12, wherein the ejector further comprises:

an ejecting cap, covering at least a portion of the ejecting member without blocking the motion path of the ejecting member, wherein the ejecting cap has an opening allowing the ejecting member to protrude outward.

19. The transfer apparatus according to claim 12, wherein the movable placement device comprises:

a first platform and a second platform, oppositely disposed of each other with a gap and capable of relatively moving.

20. A transfer apparatus, adapted for transferring at least one object on a first substrate to a second substrate, comprising:

a carrier assembly, configured to carry the first substrate and the second substrate;

a transfer assembly, configured to apply a first acting force to the object on the first substrate, so that the object is transferred to a transfer region on the second substrate in response to the applied first acting force; and a tension-holding assembly including a movable pressing member, configured to apply a second acting force to a tension-holding area on the first substrate, so that the tension-holding area comes close to the second substrate during the object being transferred.

21. The transfer apparatus according to claim 20, wherein the transfer assembly comprises:

an ejector, movably disposed on the carrier assembly and configured to:

perform an ejecting process along with a first direction to transfer the object on the first substrate to the second substrate during a first period; and move to an ejecting standby position along with a second direction, which is non-parallel to the first direction, during a second period following the first period.

22. The transfer apparatus according to claim 20, wherein the tension-holding assembly comprises:

a pressing member, movably disposed on the carrier assembly and configured to provide the second acting force by pressing the first substrate so as to establish the tension-holding area, wherein the shortest distance between the tension-holding area and the second substrate is less than the shortest distance between the area of the first substrate other than the tension-holding area and the second substrate.

23. The transfer apparatus according to claim 20, wherein the carrier assembly comprises:

a first platform, configured to carry the first substrate to move on a first working plane;

a second platform, configured to carry the second substrate to move on a second working plane substantially in parallel to the first working plane; and a third platform, configured to carry a third substrate, wherein the third substrate is pre-scanned to locate transferring area before the object transfer between the first substrate and the second substrate is complete.

\* \* \* \* \*